(12) United States Patent
Yamazaki et al.

(10) Patent No.: US 8,436,518 B2
(45) Date of Patent: May 7, 2013

(54) METHOD FOR MANUFACTURING LIGHT EMITTING DEVICE

(75) Inventors: Shunpei Yamazaki, Tokyo (JP);
Masahiko Hayakawa, Kanagawa (JP);
Koichiro Kamata, Kanagawa (JP);
Hiroyuki Tomatsu, Kanagawa (JP);
Hisao Ikeda, Kanagawa (JP); Junichiro Sakata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 24 days.

(21) Appl. No.: 12/890,893

(22) Filed: Sep. 27, 2010

(65) Prior Publication Data

US 2011/0014730 A1 Jan. 20, 2011

Related U.S. Application Data

(63) Continuation of application No. 11/259,689, filed on Oct. 26, 2005, now abandoned.

(30) Foreign Application Priority Data

Oct. 29, 2004 (JP) .................................. 2004-316742

(51) Int. Cl.
*H01L 5/48* (2006.01)
(52) U.S. Cl.
USPC ................................ 313/48; 257/59; 257/40
(58) Field of Classification Search .................... 257/59, 257/40; 313/48; 345/75
See application file for complete search history.

(56) References Cited

U.S. PATENT DOCUMENTS

| | | | |
|---|---|---|---|
| 5,670,792 A | 9/1997 | Utsugi et al. | |
| 6,542,138 B1 | 4/2003 | Shannon et al. | |
| 6,573,650 B2 * | 6/2003 | Aoki et al. | ........... 313/503 |
| 6,597,012 B2 | 7/2003 | Kido et al. | |
| 6,650,047 B2 | 11/2003 | Aoki et al. | |
| 6,693,610 B2 | 2/2004 | Shannon et al. | |
| 6,809,481 B2 | 10/2004 | Seo et al. | |
| 6,885,148 B2 | 4/2005 | Yudasaka | |

(Continued)

FOREIGN PATENT DOCUMENTS

| | | |
|---|---|---|
| CN | 1327360 A | 12/2001 |
| EP | 1 128 438 A1 | 8/2001 |

(Continued)

OTHER PUBLICATIONS

Office Action re Chinese application No. CN 200510131568.8, dated Sep. 26, 2008 (with English translation).

(Continued)

*Primary Examiner* — Long Pham
*Assistant Examiner* — Steven Rao
(74) *Attorney, Agent, or Firm* — Husch Blackwell LLP

(57) ABSTRACT

An object of the present invention is to provide a new light emitting element with little initial deterioration, and a display device in which initial deterioration is reduced and variation in deterioration over time is reduced by a new method for driving a display device having the light emitting element. One feature of the invention is that a display device comprising a light emitting element including a first electrode, a second electrode opposed to the first electrode, and a mixed layer of metal oxide and an organic compound provided between the first electrode and the second electrode is subjected to aging drive.

19 Claims, 30 Drawing Sheets

U.S. PATENT DOCUMENTS

| | | |
|---|---|---|
| 7,040,943 B2 | 5/2006 | Takahashi et al. |
| 7,166,966 B2 * | 1/2007 | Naugler et al. .............. 315/149 |
| 7,180,515 B2 | 2/2007 | Miyagawa et al. |
| 7,323,225 B2 | 1/2008 | Aoki et al. |
| 7,387,904 B2 | 6/2008 | Saito et al. |
| 7,453,453 B2 | 11/2008 | Miyagawa et al. |
| 7,485,375 B2 | 2/2009 | Tokuda et al. |
| 7,517,470 B2 | 4/2009 | Seo et al. |
| 7,879,257 B2 | 2/2011 | Seo et al. |
| 2005/0093850 A1 | 5/2005 | Mori et al. |
| 2005/0200293 A1 * | 9/2005 | Naugler et al. .............. 315/149 |

FOREIGN PATENT DOCUMENTS

| | | |
|---|---|---|
| EP | 1 489 589 A1 | 12/2004 |
| EP | 1 607 446 A1 | 12/2005 |
| JP | 4-14794 | 1/1992 |
| JP | 10-20838 | 1/1998 |
| JP | 2002-15867 | 1/2002 |
| JP | 2003-31365 | 1/2003 |
| JP | 2003-509728 | 3/2003 |
| JP | 2003-2640730 | 9/2003 |
| JP | 2003-282253 | 10/2003 |
| JP | 2004-163834 | 6/2004 |
| KR | 2001-0085420 | 9/2001 |
| WO | WO 01/20591 A1 | 3/2001 |
| WO | WO 03/075255 A1 | 9/2003 |
| WO | WO 2004/040541 A1 | 5/2004 |
| WO | WO 2004/045254 A1 | 5/2004 |
| WO | WO 2004/062322 A1 | 7/2004 |
| WO | WO 2004/085543 A1 | 10/2004 |

OTHER PUBLICATIONS

Office Action re Korean application No. KR 10-2005-0102182, dated Jun. 28, 2012 (with English translation).

* cited by examiner

METHOD FOR MANUFACTURING LIGHT EMITTING DEVICE

This application is a continuation of application Ser. No. 11/259,689 filed on Oct. 26, 2005 now abandoned.

BACKGROUND OF THE INVENTION

1. Field of the Invention

The present invention relates to a method for manufacturing a light emitting device which has a highly stable light emitting element and in which the influence of variations in the light emitting element is reduced.

2. Description of the Related Art

A display device using a light emitting element has the advantage of a wide viewing angle, high-speed response, low power consumption, or the like over that having a liquid crystal layer, and it is under development.

A short circuit occurs in some cases in a portion between electrodes included in the element depending on manufacturing conditions. Then, electric current flows intensively into the short circuit portion. At this time, a current does not flow to other regions and the light emitting element is put into a non-light-emitting state as a whole, which results in a defect.

A method is therefore proposed which does not damage a normal portion of the element when dielectric breakdown occurs in advance in a defective portion of an organic EL element (Reference 1: Japanese Patent Laid-Open No. 2003-282253).

Reference 1 discloses that, when dielectric breakdown occurs by performing aging treatment which applies voltage between an anode and a cathode of an organic EL element, the range of voltage to be applied between both electrodes is optimized. Specifically, it is disclosed to measure a current which flows by applying reverse bias voltage to the organic EL element and find breakdown voltage of the defective portion and that of the organic EL element, and then to make the voltage range of both breakdown voltages in the range of voltage applied in the aging treatment.

Reference 1 also discloses that a dedicated circuit for the aging is unnecessary since the aging can be performed using an ordinary driver circuit of the organic EL element.

The light emitting element has a problem of deterioration over time as well as initial deterioration, and variation in deterioration. Reference 1 discloses that oxygen as well as water is considered as a cause for generating a dark area that is a non-light-emitting region which progresses from a pixel edge over time, and an oxygen concentration in a filler gas used in the step of sealing the element is set equal to or less than that in the aging step.

Reference 1 also discloses a so-called passive type display panel in which an anode and a cathode are each formed in stripe shapes extending in mutually perpendicular directions. It further discloses that voltage applied for aging is selected from −8 V to −36 V.

However, applied voltage as described above may destroy a transistor in the case of an active type in which a transistor is connected to each light emitting element.

SUMMARY OF THE INVENTION

It is an object of the present invention to provide a new light emitting element with little initial deterioration, and a display device in which initial deterioration is reduced and variation in deterioration over time is reduced by a new method for driving a display device having the light emitting element.

In view of the above object, one feature of the invention is a display device (the display device of the invention is hereinafter referred to as a light emitting device) comprising a light emitting element including a first electrode, a second electrode opposed to the first electrode, and a mixed layer of metal oxide and an organic compound provided between the first electrode and the second electrode. Such a display device is subjected to aging drive. The aging drive can forcibly cause initial deterioration. By mounting the display device on a product thereafter, a light emitting device in which variation in deterioration of the light emitting element is reduced can be provided. In the aging drive, reverse voltage in addition to forward voltage may be applied to the light emitting element. Accordingly, a potential short circuit portion which may result in a defect can be detected in advance.

A specific feature of the invention is a light emitting device comprising: a light emitting element including a first electrode, a second electrode opposed to the first electrode, and a mixed layer of metal oxide and an organic compound provided between the first electrode and the second electrode; a transistor connected to the light emitting element; and a monitor light emitting element connected to the light emitting element, wherein drive is performed by applying forward voltage to the light emitting element in aging.

Another feature of the invention is a light emitting device comprising: a light emitting element including a first electrode, a second electrode opposed to the first electrode, and a mixed layer of metal oxide and an organic compound provided between the first electrode and the second electrode; a transistor connected to the light emitting element; and a monitor light emitting element connected to the light emitting element, wherein drive is performed by applying forward voltage and reverse voltage to the light emitting element in aging.

Further in the invention, at the time of operating the light emitting device, an image is displayed with the light emitting element and a location of the image may be changed at a predetermined interval. Therefore, a pixel portion is formed so that the number of pixels in the light emitting device is redundant with respect to the number of display pixels.

Note that the metal oxide is molybdenum oxide, vanadium oxide, or rhenium oxide in the invention. In place of the metal oxide, nitride or oxynitride of the metal may be used.

According to the invention, a light emitting element having a uniformed deterioration state and high stability, in other words, high reliability can be obtained. In addition, a high-quality light emitting device in which variation in deterioration over time is reduced can also be obtained.

DETAILED DESCRIPTION OF THE INVENTION

Figure 1A:
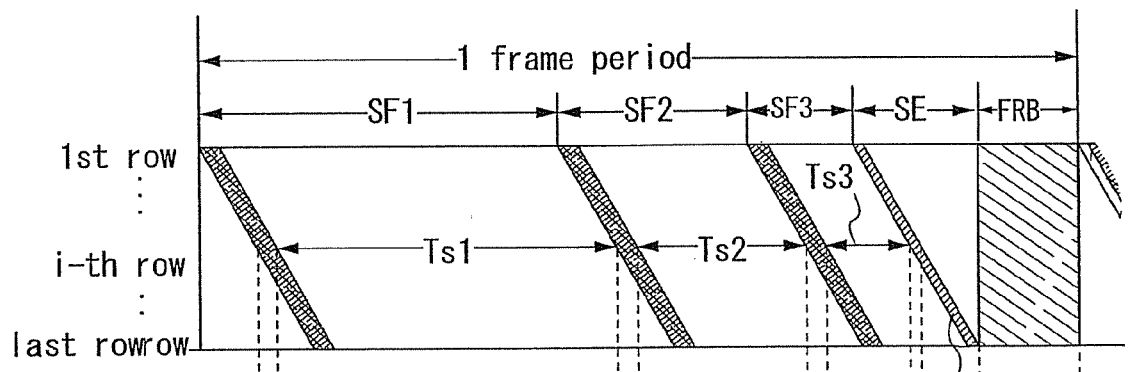
FIGS. 1A and 1B are timing charts of a driver circuit of the present invention.

Embodiment modes of the present invention are hereinafter described with reference to attached drawings. However, the present invention is not limited to the following description. As is easily known to a person skilled in the art, the mode and the detail of the invention can be variously changed without departing from the spirit and the scope of the present invention. Thus, the present invention is not interpreted while limiting to the following description of the embodiment modes. Note that the same reference numeral is used to denote the same portion or a portion having a similar function among diagrams for showing the embodiment modes, and repetitive description is omitted.

Embodiment Mode 1

As to a light emitting device, the steps of depositing a light emitting layer material and sealing are performed after completing the step of manufacturing a TFT. The light emitting device in this state is referred to as a light emitting module. In the light emitting module, a wiring for inputting an external signal is connected to a display panel which is provided with each element. Thereafter, the light emitting module is subjected to aging for a certain period, mounted on a product, and then completed as a light emitting device. In this embodiment mode, drive employed for aging (aging drive) is explained below.

In this embodiment mode, a time gray scale method in which one frame period is divided into a plurality of subframe periods is applied to the aging drive. Forward voltage can be applied, and in addition, reverse voltage can also be applied. Note that, if voltage applied to make a light emitting element emit light is referred to as forward voltage, applying reverse voltage means to apply voltage in which a higher potential and a lower potential are interchanged in forward voltage.

Figure 1B:
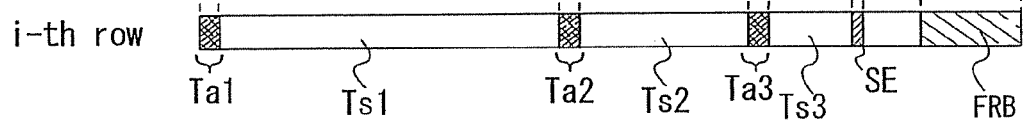

FIGS. 1A and 1B are timing charts showing an aging drive period in the case of applying reverse voltage. Note that in the case of applying only forward voltage, a timing chart in which a reverse voltage period is omitted may be used.

FIGS. 1A and 1B are timing charts showing one frame period in which 60 frames of images are rewritten in one second. The vertical axis represents a scanning line G (from the first row to the last row), and the horizontal axis represents time. Note that in the scanning line G, an arbitrary scanning line is assumed to be in the i-th row (i is a natural number).

The one frame period includes m (m is a natural number larger than 1) subframe periods SF1, SF2, . . . , SFm, and the m subframe periods SF1, SF2, . . . , SFm include write operation periods Ta1, Ta2, . . . , Tam and display periods (lighting periods) Ts1, Ts2, . . . , Tsm, respectively. The one frame period also includes a reverse voltage application period. On the other hand, a period including the write operation periods and the display periods is referred to as a forward voltage application period.

As shown in FIG. 1A, a timing chart in the case of including three subframe periods is explained in this embodiment mode. One frame period includes subframe periods SF1 to SF3. In each of write operation periods Ta1 to Ta3 included in the subframe periods, a signal is sequentially inputted to a pixel. Then, each of display periods Ts1 to Ts3 begins.

The one frame period includes a reverse voltage application period (FRB) after the display period Ts3. Note that every one frame period need not include the reverse voltage application period in the invention. The reverse voltage application period need not necessarily be provided at the end of the one frame period. It can be provided, for example, after any of the display periods Ts1 to Ts3. Further, reverse voltage can be applied to a pixel which is in a display period and does not emit light depending on a pixel structure.

A timing chart in FIG. 1B shows write operation periods Ta1 to Ta3, display periods Ts1 to Ts3, and a reverse voltage application period (FRB) in the case of focusing on a scanning line in the i-th row. After the write operation periods and the display periods begin alternately, the reverse voltage application period begins.

Initial deterioration can be caused by thus providing an aging drive period and applying forward voltage to a light emitting element. The initial deterioration in the light emitting element progresses rapidly, which leads to luminance variation. Therefore, deterioration can be slowed and luminance variation can be reduced by entirely promoting the initial deterioration in the light emitting element of a pixel portion. The initial deterioration in the light emitting element is rapid and the deterioration thereafter over time is slow.

Therefore, initial deterioration in each light emitting element is hard to control, which leads to variations in deterioration of each light emitting element.

Further, reverse voltage can be applied to the light emitting element in the aging drive period. A potential short circuit portion which may result in a defect can be detected in advance by applying reverse voltage in the aging drive period.

A factor in causing a defect in the light emitting element is a short circuit due to a minute protrusion between an anode and a cathode. When reverse voltage is applied, a large amount of current tends to flow intensively to the minute protrusion. When the amount of this current exceeds a predetermined value, dielectric breakdown occurs and a short circuit occurs between the anode and the cathode. When forward voltage is applied thereafter, the short circuit becomes a black spot and is detected as a defect. Thus, by applying reverse voltage in the aging drive period, a light emitting element with a minute protrusion, which may result in a defect, can be detected.

Such reverse voltage makes it possible to detect a potential minute protrusion, which may lead to a defect, at an early stage at the time of aging drive and to take measures against it.

When the defect is detected, it can be repaired as a measure against it. For example, the defect can be cut off or removed by laser irradiation to repair it. Display can be performed using a normally-formed light emitting region by cutting off or removing the defect, in other words, the short circuit portion.

Note that the timing of applying reverse voltage to the light emitting element, that is, the reverse voltage application period is not limited to those shown in FIGS. 1A and 1B. In other words, the reverse voltage application period need not be provided in every frame. In addition, the reverse voltage application period need not be provided in the latter half of one frame.

Anode voltage and cathode voltage of the light emitting element may be interchanged in either of the following orders: decreasing an anode potential after increasing a cathode potential, and increasing a cathode potential after decreasing an anode potential.

As is the case with the aging drive, only forward voltage can be applied, or in addition, reverse voltage can also be applied in a driving method after mounting on a product.

Embodiment Mode 2

The present invention may further have a function of correcting for deterioration in a light emitting element after mounting on a product. Thus, explained in this embodiment mode is a structure of a display panel in a light emitting module mounted with a monitor circuit which serves to correct for deterioration in the light emitting element. Note that an active type light emitting device is described in this embodiment mode.

Figure 3:
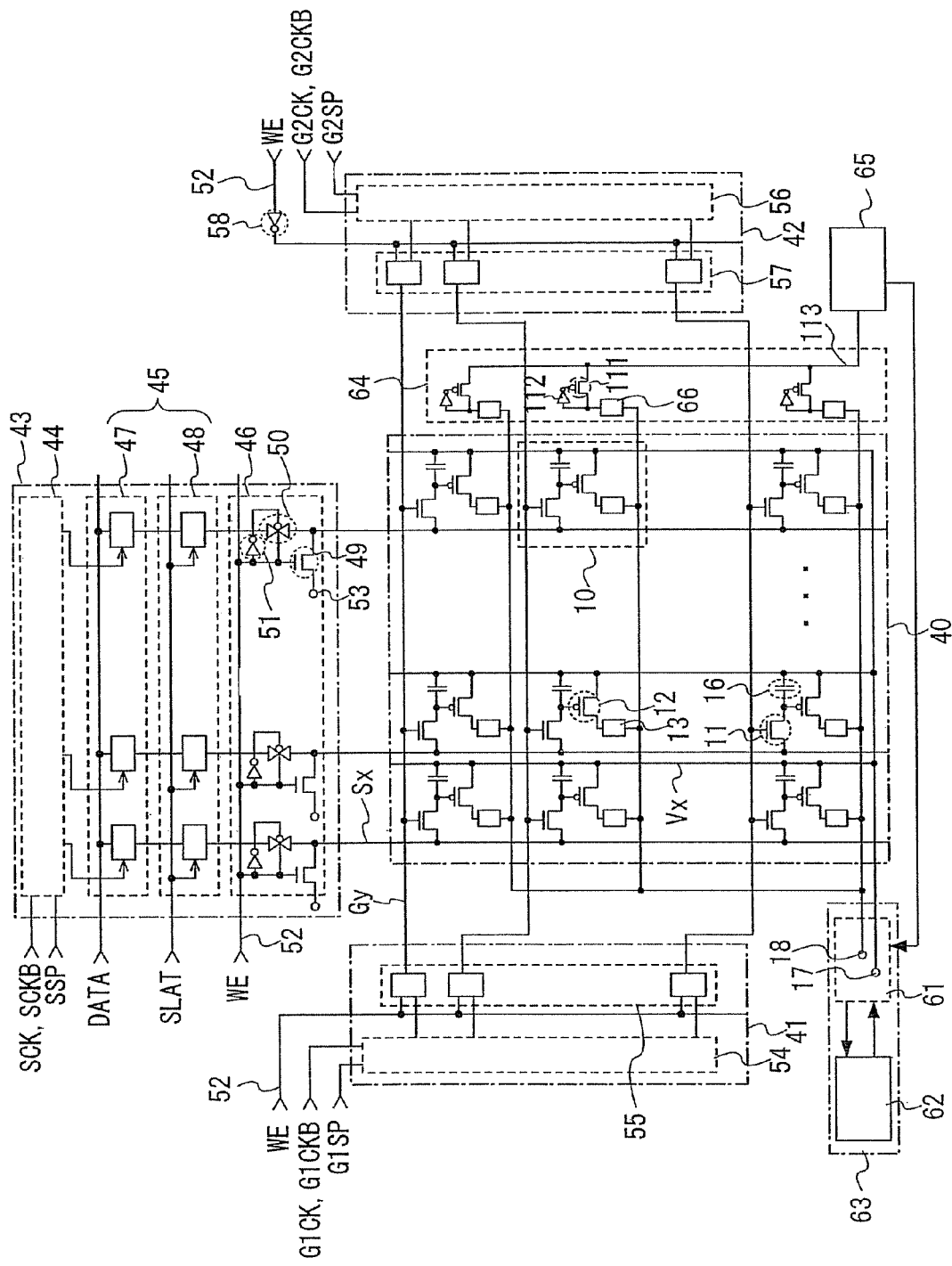
FIG. 3 shows a display panel of the present invention.

In FIG. 3, a pixel portion 40, a signal line driver circuit 43, a first scanning line driver circuit 41, a second scanning line driver circuit 42, and a monitor circuit 64 are provided over an insulating substrate.

The pixel portion 40 is provided with a plurality of pixels 10, and each pixel is provided with a light emitting element 13 and a transistor 12 which is connected to the light emitting element 13 and has a function of controlling current supply (hereinafter referred to as a driver transistor). The light emitting element is connected to a power source 18. Note that a specific circuit structure of the pixel 10 is exemplified in the following embodiment mode.

The aging drive described in the above embodiment mode can be performed in accordance with signals inputted from the signal line driver circuit 43, the first scanning line driver circuit 41, and the second scanning line driver circuit 42.

Figure 4:
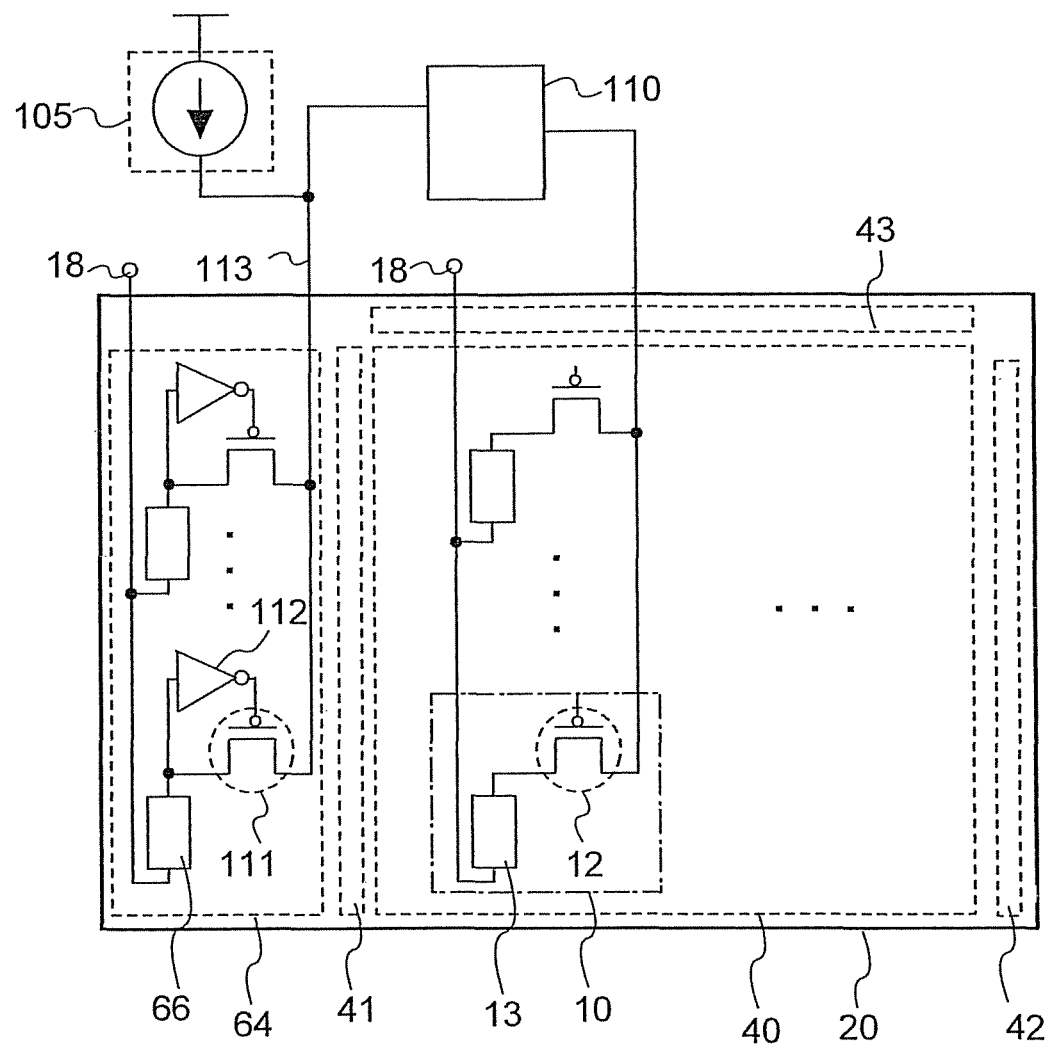
FIG. 4 shows a display panel of the present invention.

FIG. 4 is an enlarged view showing the structure of the monitor circuit 64 and the light emitting element 13 which is provided in the pixel. The monitor circuit 64 includes a monitor light emitting element 66, a transistor 111 connected to the monitor light emitting element 66 (hereinafter referred to as a monitor control transistor), and an inverter 112 whose output terminal is connected to a gate electrode of the monitor control transistor and input terminal is connected to one electrode of the monitor control transistor and the monitor light emitting element. A constant current source 105 is connected to the monitor control transistor 111 through a monitor current line (hereinafter referred to as a monitor line) 113. In this embodiment mode, the constant current source 105 may be any circuit that can supply a constant current and can be manufactured using, for example, a transistor. The monitor control transistor 111 has a function of controlling current supply from the monitor line to each of a plurality of monitor light emitting elements. Since the monitor line 113 is connected to electrodes of the plurality of monitor light emitting elements 66, a potential thereof changes along with a change in potentials of the electrodes. The constant current source may have a function of supplying a constant current to the monitor line 113.

A buffer amplifier circuit 110 is provided between the monitor circuit 64 and the pixel portion 40. The buffer amplifier circuit 110 is a circuit having characteristics such as equal input and output potentials, high input impedance, and high output current capacity. Therefore, the invention is not limited to the buffer amplifier circuit as long as a circuit having these characteristics is used. Such a buffer amplifier circuit has a function of changing voltage which is applied to the light emitting element 13 included in the pixel portion 40 along with a potential change in one electrode of the monitor light emitting element 66.

Note that the constant current source 105 and the buffer amplifier circuit 110 in FIG. 4 correspond to the monitor control circuit 65 in FIG. 3.

The monitor light emitting element 66 and the light emitting element 13 are manufactured with the same steps under the same conditions, and thus have the same structure. Therefore, they have the same or almost the same characteristics with respect to the change in ambient temperature and the deterioration over time. The following embodiment mode can be referred to for a specific structure of each light emitting element.

The monitor light emitting element 66 as described above is connected to the power source 18. Herein, the power source connected to the light emitting element 13 and the power source connected to the monitor light emitting element 66 have equal potentials; therefore, they are denoted with the same reference numeral and referred to as the power source 18.

Note that this embodiment mode is explained assuming the polarity of the monitor control transistor 111 to be a p-channel type. However, the invention is not limited thereto, and an n-channel type may alternatively be employed. In that case, a peripheral circuit structure is changed appropriately.

Note that, in this embodiment mode, the constant current source 105 and the buffer amplifier circuit 110 may be provided over the same insulting substrate 20 or different substrates.

The position of the monitor circuit 64 is not limited, and the monitor circuit 64 may be provided between the signal line driver circuit 43 and the pixel portion 40, or between the first scanning line driver circuit 41 or the second scanning line driver circuit 42 and the pixel portion 40.

In the aforementioned structure, a constant current is supplied from the constant current source 105 to the monitor light emitting element 66. When a change in ambient temperature or deterioration over time is caused in this state, a resistance of the monitor light emitting element 66 is changed. For example, when deterioration over time is caused, the resistance of the monitor light emitting element 66 is increased. Then, since a current value supplied to the monitor light emitting element 66 is constant, a potential difference between both ends of the monitor light emitting element 66 is changed. Specifically, a potential difference between both electrodes of the monitor light emitting element 66 is changed. At this time, since a potential of an electrode connected to the power source 18 is fixed, a potential of an electrode connected to the constant current source 105 is changed. This potential difference between the electrodes is supplied to the buffer amplifier circuit 110 through the monitor line 113.

In other words, the potential difference between the electrodes is inputted to an input terminal of the buffer amplifier circuit 110. A potential outputted from an output terminal of the buffer amplifier circuit 110 is supplied to the light emitting element 13 through the driver transistor 12. Specifically, the outputted potential is supplied as a potential of one electrode of the light emitting element 13.

Thus, a change in the monitor light emitting element 66 associated with a change in ambient temperature and deterioration over time is fed back to the light emitting element 13. Consequently, the light emitting element 13 can emit light with a luminance in accordance with the change in ambient temperature and the deterioration over time. Therefore, a high-quality light emitting device which can display images independently of the change in ambient temperature and deterioration over time can be provided.

Further, since the plurality of monitor light emitting elements 66 is provided, the potential changes therein can be averaged and supplied to the light emitting element 13.

An alternative to a monitor light emitting element in which a short circuit or the like occurs can be prepared by providing the plurality of monitor light emitting elements 66.

Furthermore, the monitor control transistor 111 and the inverter 112, which are connected to the monitor light emitting element 66, are provided in the invention. These are provided in consideration of malfunction of the monitor circuit 64 due to defects (including an initial defect and deterioration over time) in the monitor light emitting element 66. Specifically, a large amount of current can be prevented from being supplied due to the defect in the monitor light emitting element 66 by controlling the monitor control transistor 111 to turn on and off. The inverter 112 has a function of outputting a potential at which the monitor control transistor is turned off when any one of the plurality of monitor light emitting elements is short-circuited. In addition, the inverter 112 has a function of outputting a potential at which the monitor control transistor is turned on when none of the plurality of monitor light emitting elements is short-circuited.

Further, this embodiment mode is preferable since the plurality of monitor light emitting elements 66 is used and monitor operation can be performed even when one of them has a defect. Further, the plurality of monitor light emitting elements can average monitor operation, which is preferable.

The light emitting device of the invention preferably has a selection circuit 46 in FIG. 3. The selection circuit 46 includes a transistor 49 and an analog switch 50. The transistor 49 and the analog switch 50 are provided for each signal line. An inverter 51 has a function of generating an inverted signal of an erase signal (WE). A gate electrode of the transistor 49 is connected to a selection signal line 52. One of a source electrode and a drain electrode is connected to the signal line, and the other is connected to a power source 53. The analog switch 50 is provided between a second latch circuit 48 and each signal line. The power source 53 has a potential at which the driver transistor 12 of the pixel 10 is turned off. When the driver transistor 12 is an n-type, the power source 53 has a potential at an L level, and when the driver circuit 12 is a p-type, the power source 53 has a potential at an H level.

Figure 2A:
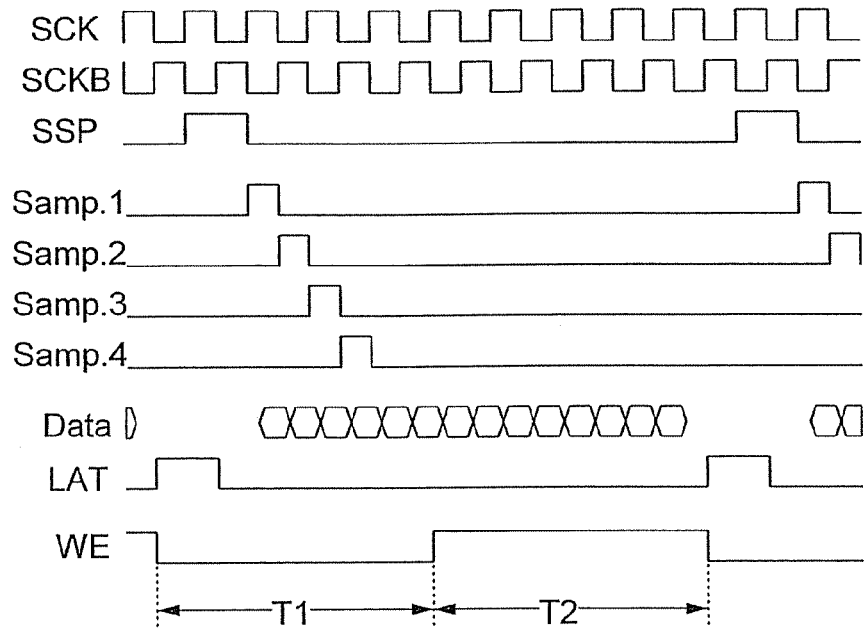
FIGS. 2A and 2B are timing charts showing a signal to a driver circuit of the present invention.
Figure 2B:
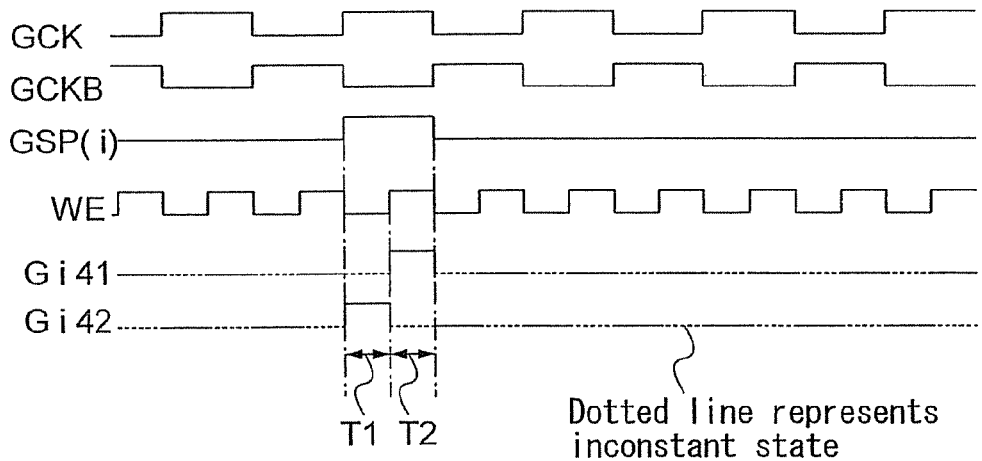

FIGS. 2A and 2B show waveforms of signals inputted to the signal line driver circuit 43, the first scanning line driver circuit 41, or the second scanning line driver circuit 42. FIG. 2A shows a start clock signal (SCK), an inverted signal thereof (SCKB), a start pulse signal (SSP), sampling signals generated based on the above signals (Samp.1 to Samp.4), a video signal (Data), a latch signal (SLAT), and an erase signal (WE) which are inputted to the signal line driver circuit 43 from outside the display panel. In a period when each sampling signal is selected, the video signal corresponding to each signal line is sequentially inputted to the first latch circuit 47 and held the second latch circuit 48 according to the latch signal.

Here, assuming that the erase signal is at an L level during a period T1 whereas the erase signal is at an H level during a period T2, the operation of the selection circuit 46 in each period is explained. Each of the periods T1 and T2 corresponds to half of a horizontal scanning period.

In the period T1, the erase signal is at an L level, the transistor 49 is in an on-state, and the analog switch 50 is in a non-conductive state. Then, a plurality of signal lines S1 to Sn is electrically connected to the power source 53 through the transistor 49 which is arranged in each column. At this time, the switching transistor 11 in the pixel 10 is in an on-state, so that a potential of the power source 53 is equal to that of the gate electrode in the driver transistor 12. Then, the driver transistor 12 is in an off-state, so that potentials of two electrodes included in the light emitting element 13 are equal to each other. No current flows between both electrodes of the light emitting element 13 and no light is emitted. Thus, independently of the state of the video signal, the potential of the power source 53 is transmitted to the gate electrode of the driver transistor 12, the switching transistor 11 is put into an off-state, and the potentials of the two electrodes included in the light emitting element 13 become equal to each other. This operation is referred to as erase operation.

In the period T2, the erase signal is at an H level, the transistor 49 is in an off-state, and the analog switch 50 is in a conductive state. Then, the video signals of one row which are held at the second latch circuit 48 are simultaneously inputted to the plurality of signal lines S1 to Sn. At this time, the switching transistor 11 in the pixel 10 is in an on-state, and the video signal is transmitted to the gate electrode of the driver transistor 12 through the switching transistor 11. In accordance with the inputted video signal, the driver transistor 12 is put in an on or off state, and the two electrodes of the light emitting element 13 each have different potentials or equal potentials. Thus, in accordance with the video signal, the driver transistor 12 is put into an on-state or an off-state, and the two electrodes of the light emitting element 13 have different potentials or equal potentials each other. This operation is referred to as write operation.

FIG. 2B shows waveforms of signals inputted to the first scanning line driver circuit 41 or the second scanning line driver circuit 42 from outside the display panel. It shows a gate clock signal (GCK), an inverted signal thereof (GCKB), a gate start pulse inputted from the first scanning line driver circuit or the second scanning line driver circuit to a scanning line in the i-th row (GSP(i)), and an erase signal (WE). Based on these signals, a potential of the scanning line is determined. Dotted lines, when a potential of the scanning line is at an L level, represent an inconstant state.

Also in a period when the scanning line is selected, T1 and T2 are similarly provided. Accordingly, write operation and erase operation can be performed on each light emitting element arranged in a grid form.

As described above, the light emitting device of the invention can preferably have the selection circuit 46, and a driving method which performs erase operation and write operation can be applied thereto. With such a driving method, an aperture ratio can be improved since the switching transistor 11 and the driver transistor 12 are sufficient as transistors in the pixel 10.

The aging drive described in the above embodiment mode can be performed using the drive waveforms shown in FIGS. 2A and 2B.

Note that the driving method of the invention is not limited thereto and can be determined depending on the pixel structure.

Embodiment Mode 3

In the invention, after mounting the light emitting module on a product, reverse voltage in addition to forward voltage may be applied to the light emitting element 13 and the monitor light emitting element 66. Thus, the case of applying reverse voltage after mounting the light emitting module is explained in this embodiment mode.

Explanation is made using the monitor light emitting element 66. In order to apply reverse voltage, anode and cathode potentials of the monitor light emitting element are interchanged. Therefore, a potential of the monitor line 113 is made lower than that of the power source 18. As well as the light emitting element 13, in order to apply reverse voltage, anode and cathode potentials may be interchanged.

At this time, the cathode potential is preferably reversed after reversing the anode potential in the light emitting element 13 and the monitor light emitting element 66. After a predetermined reverse voltage period, the anode potential is returned and the cathode potential is then returned.

As described above, a driving method in which reverse voltage is applied can be employed after mounting the light emitting module. Note that the drive in which reverse voltage is applied after mounting the light emitting module can be performed using a driver circuit similar to that used for the aging drive. Therefore, a new driver circuit for aging drive need not be provided. In addition, FIGS. 1A and 1B can be referred to for a timing chart of the drive.

As a result of applying reverse voltage to the light emitting element after mounting the light emitting module on a product, defective conditions of the light emitting element 13 and the monitor light emitting element 66 can be improved to increase reliability. Further, in some cases, the light emitting element 13 and the monitor light emitting element 66 may have an initial defect that an anode and a cathode are short-circuited due to adhesion of foreign materials, a pinhole generated by a minute protrusion in the anode or the cathode, and nonuniformity of an electroluminescent layer. When such an initial defect is caused, lighting and non-lighting are not performed in accordance with a signal and most current flows through a short-circuited element. Consequently, a problem that an image is not favorably displayed is caused. This defect may be caused in an arbitrary pixel.

Another short circuit between the anode and the cathode may occur over time (deterioration over time) after mounting the light emitting module. Such a defect is also referred to as a progressive defect. Even when the progressive defect is caused, the defect can be corrected by periodically applying reverse voltage to the light emitting element 13 and the monitor light emitting element 66 as in the invention. The light emitting element 13 or the monitor light emitting element 66 can be operated normally.

When reverse voltage is applied to the light emitting element 13 and the monitor light emitting element 66, current flows locally to the short-circuited portion. The short-circuited portion generates heat to be oxidized or carbonized, and the short-circuited portion can be insulated. Then, current flows to a region other than the short-circuited portion, and the light emitting element 13 or the monitor light emitting element 66 can be operated normally.

In addition, application of reverse voltage can prevent image burn-in. The image burn-in is caused by deterioration in the light emitting element 13, and becomes notably recognized when it varies. However, the deterioration can be reduced by applying reverse voltage as in the invention. Consequently, the image burn-in can be prevented.

Embodiment Mode 4

In the invention, a structure for preventing burn-in caused by luminance variation in a light emitting element may be provided. Thus, the structure for preventing burn-in is explained in this embodiment mode.

In a pixel portion of a light emitting device to be described in this embodiment mode, the number of pixels is redundant with respect to that of display pixels. The number of display pixels is the number of pixels corresponding to data of one frame. A display screen can be shifted by thus providing pixels in redundant numbers. Accordingly, burn-in of the display screen can be prevented.

Figure 8A:
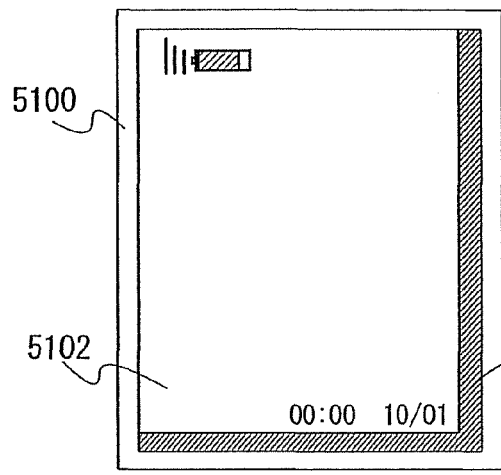
FIGS. 8A to 8D show a displaying method for a light emitting device of the present invention.
Figure 8B:
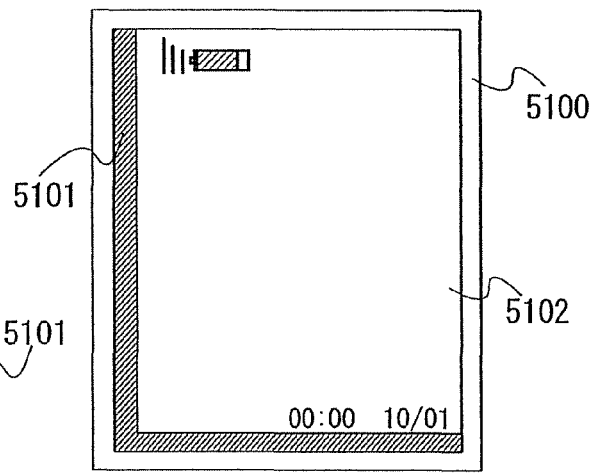
Figure 8C:
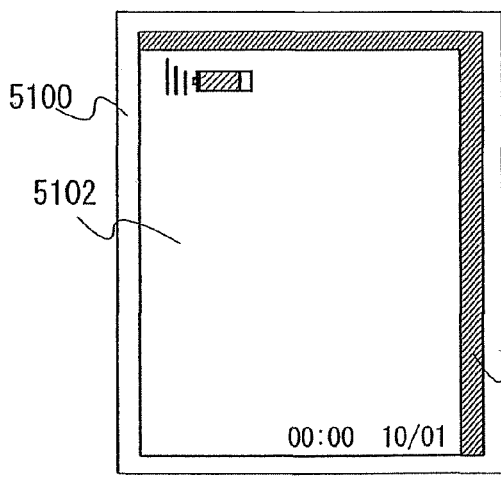
Figure 8D:
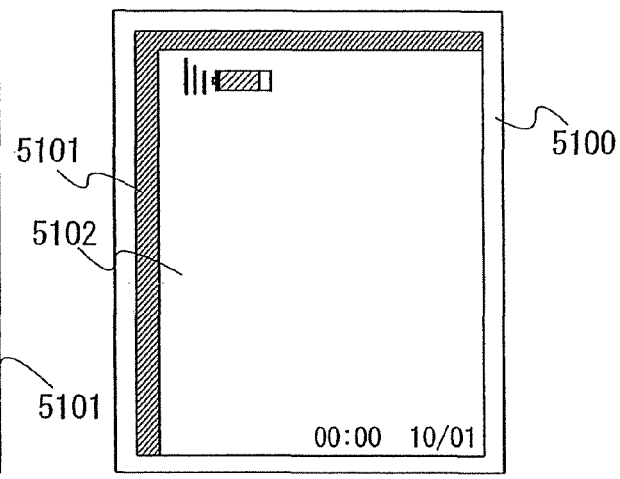

Operation of such a display screen is explained with reference to FIGS. 8A to 8D. A display panel 5100 has a display region 5101 provided with a plurality of pixels. In a period during displaying the display screen, a display screen 5102 is positioned in the upper left of the display region 5101 as shown in FIG. 8A. In another period, the display screen 5102 is positioned in the upper right of the display region 5101 as shown in FIG. 8B. In still another period, the display screen 5102 is positioned in the lower left as shown in FIG. 8C. In yet another period, the display screen 5102 is positioned in the lower right as shown in FIG. 8D. Thus, the display screen is shifted. It is preferable to shift the display screen in this manner, since a user does not feel uncomfortable.

Accordingly, deterioration progress of the light emitting element in the display region is uniformed, and burn-in of the display screen can be reduced.

Figure 9A:
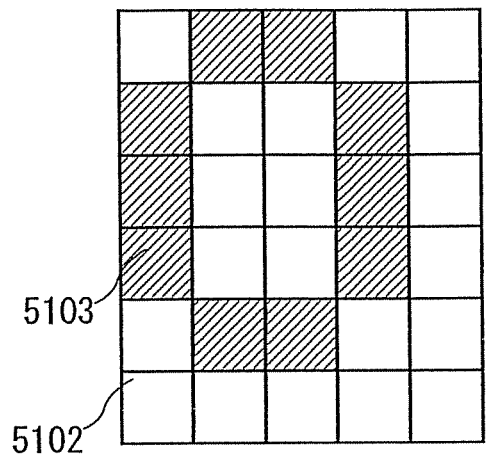
FIGS. 9A to 9D show a displaying method for a light emitting device of the present invention.
Figure 9B:
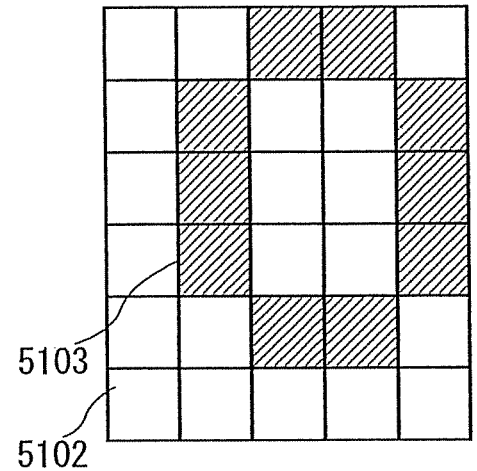
Figure 9C:
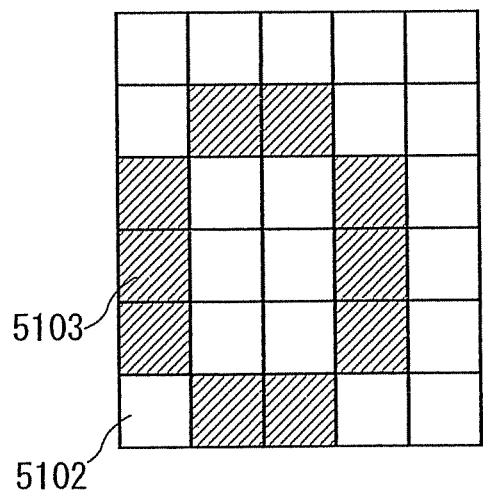
Figure 9D:
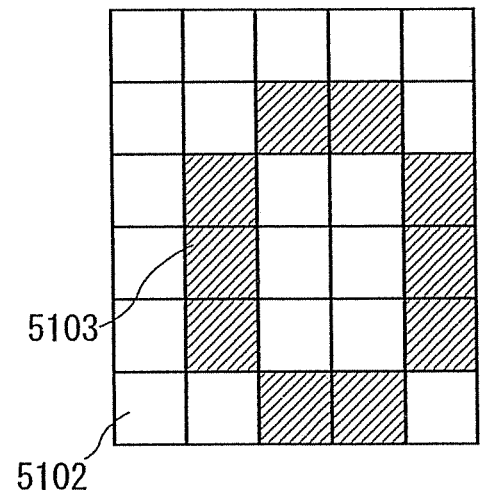

Note that FIGS. 8A to 8D show that the display screen 5102 is shifted at a maximum and then positioned in an end of the display region 5101. However, the invention is not limited thereto. For example, an image displayed in the display region 5101 may be shifted in various directions without shifting the display screen 5102 in the display region 5101. Specifically, the case of shifting a certain figure in the display region is explained hereinafter. In a period, a figure or the like is positioned in the display region 5101 as shown in FIG. 9A. In another period, the figure or the like is shifted by one pixel to the right from FIG. 9A as shown in FIG. 9B. In still another period, the figure or the like is shifted one pixel down from FIG. 9A as shown in FIG. 9C. In yet another period, the figure or the like is shifted by one pixel to the right from FIG. 9C as shown in FIG. 9D. Thus, the figure or the like is shifted from pixel to pixel. In this case, the number of pixels need not be redundant with respect to that of display pixels.

As described above, an image displayed in the display region 5101 may be shifted in various directions. In other words, an image may be prevented from being displayed in the same position for a long time.

In particularly, a light emitting element used for an icon, for example, display of clock, battery, radio wave condition, or the like, which needs to be displayed in the same position for a long time, tends to deteriorate more drastically than other light emitting elements. Then, burn-in tends to be easily caused. The burn-in can be prevented by shifting a display screen as in this embodiment mode.

Embodiment Mode 5

In the invention, the light emitting element includes a mixed layer of metal oxide and an organic compound. The light emitting element can be thickened by using such a mixed layer since there is little variation in voltage to be applied even when the mixed layer is thickened. Note that an experiment for proving that there is little variation in voltage to be applied is described in the following embodiment. In this embodiment mode, explained is a structure of the light emitting element having a mixed layer of metal oxide and an organic compound.

Figure 10:
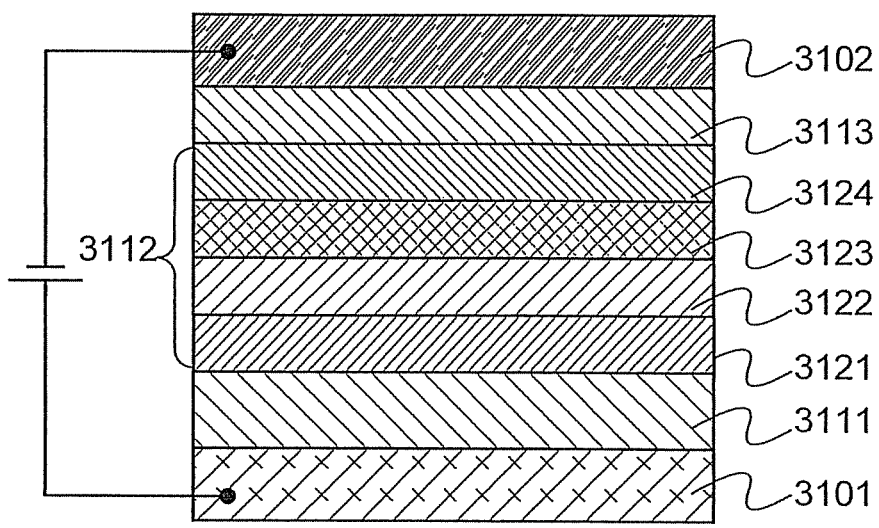
FIG. 10 shows a light emitting element of the present invention.

As shown in FIG. 10, the light emitting element of the invention has a first electrode 3101 and a second electrode 3102 opposed to each other, and a first layer 3111, a second layer 3112, and a third layer 3113 are sequentially laminated over the first electrode 3101. In such a light emitting element, when voltage is applied so that a potential of the first electrode 3101 becomes higher than that of the second electrode 3102, a hole is injected from the first layer 3111 to the second layer 3112 and an electron is injected from the third layer 3113 to the second layer 3112. The hole and the electron are recombined in the second layer 3112 to excite a light emitting material. Then, the excited light emitting material emits light when returning to a ground state.

Among such light emitting elements, each light emitting element can be thickened. In addition, the thickness of at least one of the layers except the first electrode and the second electrode can be preferably differentiated in each of light emitting elements which emit light of each color. Accordingly, light extraction efficiency of each color can be increased. For example, light emitting elements which emit light of red (R), green (G), and blue (B) share the first electrode 3101 having a non-light-transmitting property and the second electrode 3102 having a light-transmitting property, and each of them has the first layer, the second layer, and the third layer. Then, the first layers can be differentiated for each emission color. Accordingly, a decrease in light extraction efficiency can be prevented which is caused by the difference in light path between the case of recognizing light directly through the second electrode and the case of recognizing light reflected by the first electrode through the second electrode.

Specifically, when light enters the first electrode, phase reversal occurs in the reflected light, thereby producing a light interference effect. Consequently, in the case where an optical distance between a light emitting region and a reflecting electrode (i.e., refractive index×distance) is the emission wavelength multiplied by $(2m-1)/4$ (m is a given positive integer) or 1/4, 3/4, 5/4 . . . of the emission wavelength, the light extraction efficiency is increased. In the meanwhile, in the case where the optical distance is the emission wavelength multiplied by m/2 (m is a given positive integer) or 1/2, 1, 3/2 . . . of the emission wavelength; the light-extraction efficiency is decreased.

Therefore, in each light emitting element of the invention, the thickness of any of the first to third layers is differentiated so that the optical distance between the light emitting region and the reflecting electrode, in other words, refractive index× distance is the emission wavelength multiplied by $(2m-1)/4$ (m is a given positive integer).

Specifically, in the first to third layers, the thickness of a layer between the layer in which electrons and holes are recombined and the reflecting electrode may be differentiated. Alternatively, the thickness of a layer between the layer in which electrons and holes are recombined and a light-transmitting electrode may be differentiated. Further alternatively, the thicknesses of both layers may be differentiated. Consequently, light can be extracted outside efficiently.

Specifically, when the first to third layers are formed by an evaporation method using an evaporation mask to differentiate the thickness of at least one of the layers, the same evaporation mask can be used. On the other hand, to differentiate the thickness of the electrode, a photolithography step and an etching step are needed, which leads to an increase in the number of steps.

In other words, the present invention can prevent the light extraction efficiency from decreasing without increasing the number of steps.

In order to differentiate each thickness of any of the first to third layers, a layer is thickened. Thus, in the invention, a mixed layer of an organic compound and metal oxide that is an inorganic compound is used as the layer to be thickened.

Generally, it is not preferable to thicken a layer in the light emitting element, since drive voltage is increased. However, as described in the following embodiments, the present inventors have found that, by using a layer containing an organic compound and metal oxide that is an inorganic compound as a layer to be thickened, the drive voltage itself is decreased and it is not increased even when the layer is thickened.

By thickening any of the first to third layers, a short circuit between the first and second electrodes can be prevented, and a new light emitting element with little initial deterioration can be provided. Consequently, productivity of the light emitting device can be improved, which is extremely preferable.

Next, materials of the first to third layers and the electrodes are explained.

The first layer 3111 is a hole generating layer. As the first layer 111, for example, a layer containing a hole transporting substance and a substance having a property of accepting electrons from the hole transporting substance can be used. The substance having a property of accepting electrons from the hole transporting substance is preferably contained with respect to the hole transporting substance so as to satisfy a molar ratio (i.e., the substance having a property of accepting electrons from the hole transporting substance/the hole transporting substance) of 0.5 to 2.

The hole transporting substance is a substance having a property of transporting holes rather than electrons. An organic compound, for example, an aromatic amine compound such as 4,4'-bis[N-(1-naphthyl)-N-phenylamino]biphenyl (abbr.: α-NPD), 4,4'-bis[N-(3-methylphenyl)-N-phenylamino]biphenyl (abbr.: TPD), 4,4',4"-tris(N,N-diphenylamino)triphenylamine (abbr.: TDATA), 4,4',4"-tris[N-(3-methylphenyl)-N-phenylamino]triphenylamine (abbr.: MTDATA), or 4,4'-bis{N-[4-(N,N-di-m-tolylamino)phenyl]-N-phenylamino}biphenyl (abbr.: DNTPD), a phthalocyanine compound such as phthalocyanine (abbr.: $H_2Pc$);

copper phthalocyanine (CuPc), or vanadyl phthalocyanine (abbr.: VOPc), or the like can be used. Note that the hole transporting substance is not limited to these materials.

As the substance having a property of accepting electrons from the hole transporting substance, for example, metal oxide such as molybdenum oxide, vanadium oxide, or ruthenium oxide can be used. Further, nitride or oxynitride of the metal can also be employed. Note that the substance having a property of accepting electrons from the hole transporting substance is not limited thereto.

The first layer 3111 in which the hole transporting substance and the substance having a property of accepting electrons from the hole transporting substance are mixed can be formed by a co-evaporation method. Specifically, the first layer 3111 can be formed by combining the same kind of methods or different kinds of methods, for example, a co-evaporation method using resistance heating evaporation, a co-evaporation method using electron beam evaporation, a co-evaporation method using resistance heating evaporation and electron beam evaporation, a formation method using resistance heating evaporation and sputtering, a formation method using electron beam evaporation and sputtering, and the like. In addition, the above described examples are given in consideration of forming a layer containing two kinds of materials; however, a layer containing three or more kinds of materials can also be formed by combining the same kind of methods or different kinds of methods.

The first layer 3111 may contain another organic compound, for example, rubrene. Reliability can be enhanced by adding rubrene.

In addition, the first layer 3111 may be a layer containing metal oxide such as molybdenum oxide, vanadium oxide, ruthenium oxide, cobalt oxide, or copper oxide. In addition, nitride or oxynitride of the metal may be employed.

However, it is preferable to form the first layer 3111 with the layer containing an organic compound and metal oxide as described above, since the conductivity can be improved. When the conductivity is high, the first layer 3111 can be thickened.

The second layer 3112 is a layer including a light emitting layer. The second layer 3112 may have a single layer structure or a multilayer structure. For example, as shown in FIG. 10, the second layer 3112 may have a multilayer structure including an electron transporting layer 3124, a hole transporting layer 3122, and a hole injecting layer 3121 as well as the light emitting layer 3123, or a single layer of the light emitting layer 3123. Note that the light emitting substance is a substance which has favorable light emitting efficiency and can emit light of a desired emission wavelength.

The second layer 3112 is preferably a layer in which a light emitting substance is dispersed in a layer of a substance having a larger energy gap than that of the light emitting substance. However, the second layer is not limited thereto. Note that the energy gap refers to an energy gap between the LUMO level and the HOMO level. Further, the light emitting substance may be a substance which has favorable light emitting efficiency and can emit light of a desired emission wavelength.

As a substance used for dispersing the light emitting substance, for example, an anthracene derivative such as 9,10-di(2-naphthyl)-2-tert-butylanthracene (abbr.: t-BuDNA), a carbazole derivative such as 4,4'-bis(N-carbazolyl)biphenyl (abbr.: CBP), a metal complex such as bis[2-(2-hydroxyphenyl)pyridinato]zinc (abbr.: Znpp$_2$) or bis[2-(2-hydroxyphenyl)benzoxazolato]zinc (ZnBOX), or the like can be used. However, the substance used for dispersing the light emitting substance is not particularly limited to these materials. The structure as described above can prevent light emitted from the light emitting substance from quenching due to concentration.

When the second layer 3112 is formed to be a light emitting layer for emitting white light, the second layer 3112 is formed by sequentially laminating TPD (aromatic diamine), 3-(4-tert-buthylphenyl)-4-phenyl-5-(4-biphenylyl)-1,2,4-triazole (abbr.: TAZ), tris(8-quinolinolato)aluminum (abbr.: Alq$_3$), Alq$_3$ doped with Nile Red that is a red light emitting pigment, and Alq$_3$ over the first electrode 101 by an evaporation method or the like.

Alternatively, it may be formed by sequentially laminating NPB, NPB doped with perylene, bis(2-methyl-8-quinolinolato)-4-phenylphenolate-aluminum (abbr.: BAlq) doped with DCM 1, BAlq, and Alq$_3$ over the first electrode 101 by an evaporation method or the like.

In addition, white light emission can be obtained by dispersing 2-(4-biphenylyl)-5-(4-tert-buthylphenyl)-1,3,4-oxadiazole (abbr.: PBD) of 30 wt % as an electron transport agent into PVK and dispersing an adequate amount of four kinds of pigments (TPB, coumarin 6, DCM 1, Nile Red).

Note that materials of the light emitting layer can be appropriately selected from materials other than the above-described light emitting material which can provide white light emission.

Further, white light emission can also be obtained when the second layer 3112 has a laminated structure and materials which exhibit emission colors having a complementary color relationship with each other, for example, red and blue-green are used as light emitting materials of a first layer and a second layer.

Moreover, the second layer 3112 may be formed using light emitting materials for red (R), green (G), and blue (B).

In order to obtain red light emission, the following substance can be employed: 4-dicyanomethylene-2-isopropyl-6-[2-(1,1,7,7-tetramethyljulolidine-9-yl)ethenyl]-4H-pyran (abbr.: DCJTI), 4-dicyanomethylene-2-methyl-6-[2-(1,1,7,7-tetramethyljulolidine-9-yl)ethenyl]-4H-pyran (abbr.: DCJT), 4-dicyanomethylene-2-tert-butyl-6-[2-(1,1,7,7-tetramethyljulolidine-9-yl)ethenyl]-4H-pyran (abbr.: DCJTB), periflanthene, 2,5-dicyano-1,4-bis[2-(10-methoxy-1,1,7,7-tetramethyljulolidine-9-yl)ethenyl]benzene, bis[2,3-bis(4-fluorophenyl)quinoxalinato]iridium(acetylacetonato) (abbr.: Ir[Fdpq]$_2$(acac)), or the like. However, the present invention is not limited to these materials, and a substance which can emit light with a peak of emission spectrum in 600 nm to 680 nm can be used.

In order to obtain green light emission, N,N'-dimethylquinacridon (abbr.: DMQd), coumarin 6, coumarin 545T, tris(8-quinolinolato)aluminum (abbr.: Alq$_3$), or the like can be employed. However, the present invention is not limited to these materials, and a substance which can emit light with a peak of emission spectrum in 500 nm to 550 nm can be used.

In order to obtain blue light emission, the following substance can be employed: 9,10-bis(2-naphthyl)-tert-butylanthracene (abbr.: t-BuDNA), 9,9'-bianthryl, 9,10-diphenylanthracene (abbr.: DPA), 9,10-bis(2-naphthyl)anthracene (abbr.: DNA), bis(2-methyl-8-quinolinolato)-4-phenylphenolate-gallium (abbr.: BGaq), bis(2-methyl-8-quinolinolato)-4-phenylphenolate-aluminum (BAlq), or the like. However, the present invention is not limited to these materials, and a substance which can emit light with a peak of emission spectrum in 420 nm to 500 nm can be used.

The third layer 3113 is an electron generating layer. As the third layer 3113, for example, a layer containing an electron transporting substance and a substance having a property of donating electrons to the electron-transporting substance can be used. Note that the electron transporting substance is a substance having a property of transporting electrons rather than holes. For example, a metal complex such as tris(8-quinolinolato)aluminum (abbr.: Alq$_3$), tris(4-methyl-8-quinolinolato)aluminum (abbr.: Almq$_3$), bis(10-hydroxybenzo[h]-quinolinato)beryllium (abbr.: BeBq$_2$), bis(2-methyl-8-quinolinolato)-4-phenylphenolate-aluminum (abbr.: BAlq), bis[2-(2-hydroxyphenyl)benzoxazolate]zinc (abbr.: Zn(BOX)$_2$), or bis[2-(2-hydroxyphenyl)benzothiazolate]zinc (abbr.: Zn(BTZ)$_2$) can be used. In addition, the following substance can be used as the electron transporting substance: 2-(4-biphenylyl)-5-(4-tert-butylphenyl)-1,3,4-oxadiazole (abbr.: PBD), 1,3-bis[5-(p-tert-butylphenyl)-1,3,4-oxadiazole-2-yl]benzene (abbr.: OXD-7), 3-(4-tert-butylphenyl)-4-phenyl-5-(4-biphenylyl)-1,2,4-triazole (abbr.: TAZ), 3-(4-tert-butylphenyl)-4-(4-ethylphenyl)-5-(4-biphenylyl)-1,2,4-triazole (abbr.: p-EtTAZ), bathophenanthroline (abbr.: BPhen); bathocuproin (abbr.: BCP), 4,4'-bis(5-methylbenzoxazol-2-yl)stilbene (abbr.: BzOS), or the like. However, the electron transporting substance is not limited to these materials.

Further, alkali metal such as lithium or cesium, alkaline earth metal such as magnesium or calcium, rare-earth metal such as erbium or ytterbium, or the like can be used as the substance having a property of donating electrons to the electron transporting substance. However, the substance having a property of donating electrons to the electron transporting substance is not limited thereto. Note that the substance having a property of donating electrons to the electron transporting substance is preferably contained with respect to the electron transporting substance so as to satisfy a molar ratio (i.e., the substance having a property of donating electrons to the electron transporting substance/the electron transporting substance) of 0.5 to 2.

Additionally, the third layer 3113 may be a layer containing a substance such as zinc oxide, zinc sulfide, zinc selenide, tin oxide, or titanium oxide.

In the above-described light emitting element, a difference in electron affinity between the electron transporting substance contained in the third layer 3113 and a substance contained in a layer in contact with the third layer 3113 among the layers included in the second layer 3112 is preferably 2 eV or less, more preferably, 1.5 eV or less. When the third layer 3113 is made using an n-type semiconductor, a difference between a work function of the n-type semiconductor and the electron affinity of the substance contained in the layer in contact with the third layer 3113 among the layers included in the second layer 3112 is preferably 2 eV or less, more preferably, 1.5 eV or less.

Note that the layer in contact with the third layer 3113 among the layers included in the second layer 3112 corresponds to the electron transporting layer 3124 in the case where the second layer 3112 has a laminated structure.

The second layer 3112 may have a single layer structure of a light emitting layer or a structure without the electron transporting layer 3124 or the like.

As described above, the second layer 3112 and the second electrode 3102 are joined by the third layer 3113, and thus, electrons can be easily injected from the second electrode 3102 into the second layer 3112.

Then, the electrodes are explained. One of the first electrode 3101 and the second electrode 3102 is formed using a conductive substance which can transmit visible light. Therefore, light can be extracted outside through one of the first electrode 3101 and the second electrode 3102.

As a material for forming the first electrode 3101, in addition to aluminum (Al) or a light-transmitting material such as indium tin oxide (ITO), indium tin oxide containing silicon oxide (also referred to as ITSO), or indium oxide containing zinc oxide of 2% to 20%, a metal material of gold (Au), platinum (Pt), nickel (Ni), tungsten (W), chromium (Cr), molybdenum (Mo), iron (Fe), cobalt (Co), copper (Cu), palladium (Pd), or the like. The first electrode can have a single-layer structure of one of these materials or a laminated structure of them. When the first electrode needs to have a light-transmitting property, even in the case of using a metal material having a non-light-transmitting property, it can be formed to have transparency by being thinned. Further, a light-transmitting material may be laminated thereover. Naturally, a single layer of a semi-transparent metal material may be used. Note that materials of the first electrode 3101 are not limited to these materials.

As a material for forming the second electrode 3102, in addition to a light-transmitting material such as indium tin oxide (ITO), indium tin oxide containing silicon oxide (ITSO), or indium oxide containing zinc oxide of 2% to 20%, a metal material of gold (Au), platinum (Pt), nickel (Ni), tungsten (W), chromium (Cr), molybdenum (Mo), iron (Fe), cobalt (Co), copper (Cu), palladium (Pd), or the like. The second electrode 3102 can have a single-layer structure of one of these materials or a laminated structure of them. When the second electrode needs to have a light-transmitting property, even in the case of using a metal material having a non-light-transmitting property, it can be formed to have transparency by being thinned. Further, a light transmitting material may be laminated thereover. Naturally, a single layer of a transparent metal material may be used. Note that materials of the second electrode 3102 are not limited to these materials.

The first electrode 3101 or the second electrode 3102 can be formed by a sputtering method, an evaporation method, or the like.

As described above, the electron transporting layer 3124 can be formed between the third layer 3113 and the light emitting layer 3123. In this manner, the distance from the light emitting layer 3123 to the second electrode 3102 or the third layer 3113 containing metal can be increased by providing the electron transporting layer 3124. Thus, light can be prevented from quenching due to the metal. Note that the electron transporting layer 3124 has a function of transporting electrons injected from the second electrode 3102 to the light emitting layer 3123.

The electron transporting layer 3124 can be formed using the above-described Alq$_3$, Almq$_3$, BeBq$_2$, BAlq, Zn(BOX)$_2$, Zn(BTZ)$_2$, PBD, OXD-7, TAZ, p-EtTAZ, BPhen, BCP, or the like. Without being limited to these materials, the electron transporting layer may be fowled by using an electron transporting substance in which the electron mobility is higher than the hole mobility. Specifically, the electron transporting layer 3124 is preferably fowled by using a substance having the electron mobility of $10^{-6}$ cm$^2$/Vs or more. Further, the electron transporting layer 3124 may have a multilayer structure formed by combining two or more layers made from the above-described substances.

In this embodiment mode, as shown in FIG. 10, the hole transporting layer 3122 can be formed between the first electrode 3101 and the light emitting layer 3123. In this manner, the distance from the light emitting layer 3123 to the first electrode 3101 or the first layer 3111 containing metal oxide can be increased by providing the hole transporting layer 3122. Thus, light can be prevented from quenching due to the metal. Note that the hole transporting layer 3122 has a function of transporting holes injected from the first electrode 3101 to the light emitting layer 3123.

The above-described α-NPD, TPD, TDATA, MTDATA, DNTPD, or the like can be used for the hole transporting layer 3122. However, the hole transporting layer 3122 is not particularly limited thereto. The hole transporting layer 3122 can be formed using the above-described hole transporting substance in which the hole mobility is higher than the electron mobility. Specifically, the hole transporting layer 3122 is preferably formed using a substance having the hole mobility of $10^{-6}$ cm$^2$/Vs or more. The hole transporting layer 3122 may have a multilayer structure formed by combining two or more layers made from the above-described substances.

As shown in FIG. 10, the hole injecting layer 3121 may be provided between the first electrode 3101 and the hole transporting layer 3122. Note that the hole injecting layer 3121 has a function of helping the injection of holes into the hole transporting layer 3122 from the first electrode 3101. Note that, since the first layer 3111 exists, the hole injecting layer 3121 is not necessarily provided. In other words, the first layer 3111 can have a function of helping hole injection.

The hole injecting layer 3121 can be formed using metal oxide such as molybdenum oxide, vanadium oxide, ruthenium oxide, tungsten oxide, or manganese oxide. In addition, the hole injecting layer 3121 can be fowled using the above-described phthalocyanine compound such as $H_2Pc$, CuPC, or VOPc, the aromatic amine compound such as DNTPD, or a high molecular weight material such as a poly(ethylenedioxythiophene)/poly(styrene sulfonate) mixture (PEDOT/PSS). Furthermore, the hole injecting layer 3121 may be formed using the above-described layer containing the hole transporting substance and the substance having a property of accepting electrons from the hole transporting substance. However, the hole injecting layer 3121 is not limited thereto. In addition, the hole injecting layer 3121 can also serve as the first layer 3111.

Thus, it is extremely preferable to perform the aging drive on the light emitting element which can be thickened. The reason is as follows. When the light emitting element is thin, a plurality of short circuits is caused between the anode and cathode. The aging drive needs to be performed for a long time in order to repair the short circuits in the light emitting element. However, in the thickened light emitting element as in the present invention, the number of short circuits between the anode and cathode is reduced; therefore, the short circuits can be easily repaired by performing the aging drive.

Embodiment Mode 6

In this embodiment mode, an equivalent circuit diagram of a pixel included in a light emitting device is explained with reference to FIGS. 13A and 13B, and 14.

Figure 13A:
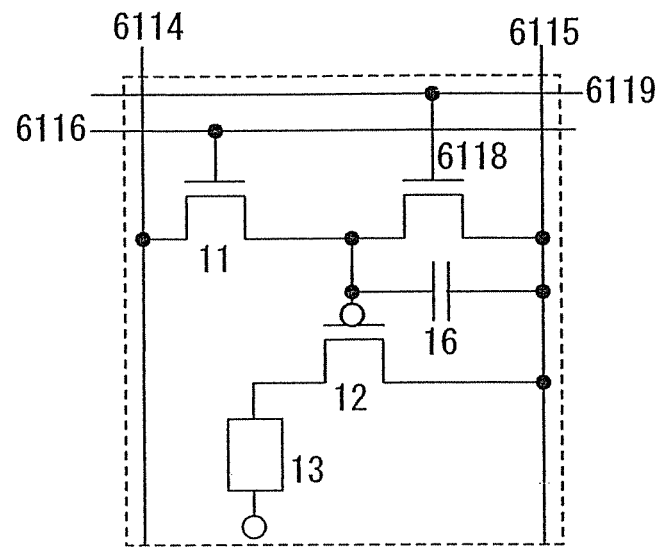
FIGS. 13A and 13B show a pixel circuit to be applied to a light emitting device of the present invention.

FIG. 13A is an example of an equivalent circuit diagram of a pixel, which includes a signal line 6114, a power supply line 6115, scanning lines 6116 and 6119, and a light emitting element 13, transistors 11, 12, and 6118, and a capacitor element 16 in a region within the signal line 6114, the power supply line 6115, and the scanning lines 6116 and 6119. A video signal is inputted to the signal line 6114 from a signal line driver circuit. The transistor 11 is referred to as a switching transistor, which can control supply of a potential of the video signal to a gate of the transistor 12 in accordance with a selection signal inputted to the scanning line 6116. The transistor 12 is referred to as a driver transistor, which can control supply of current to the light emitting element 13 in accordance with the potential of the video signal. Display can be performed depending on a light-emitting condition of the light emitting element in accordance with the current to be supplied. The capacitor element 16 can hold voltage between a gate and a source of the transistor 12. The transistor 6118 is referred to as an erase transistor, which can forcibly flow no current into the light emitting element 13 by making potentials of the gate and a source of the transistor 12 equal to each other. Therefore, the length of a subframe period can be shorter than that of a period for inputting a video signal into all pixels. Note that the capacitor element 16 is shown in FIG. 13A; however, it is not required to be provided if the gate capacitance of the transistor 12 or the other parasitic capacitance can substitute for it.

Figure 13B:
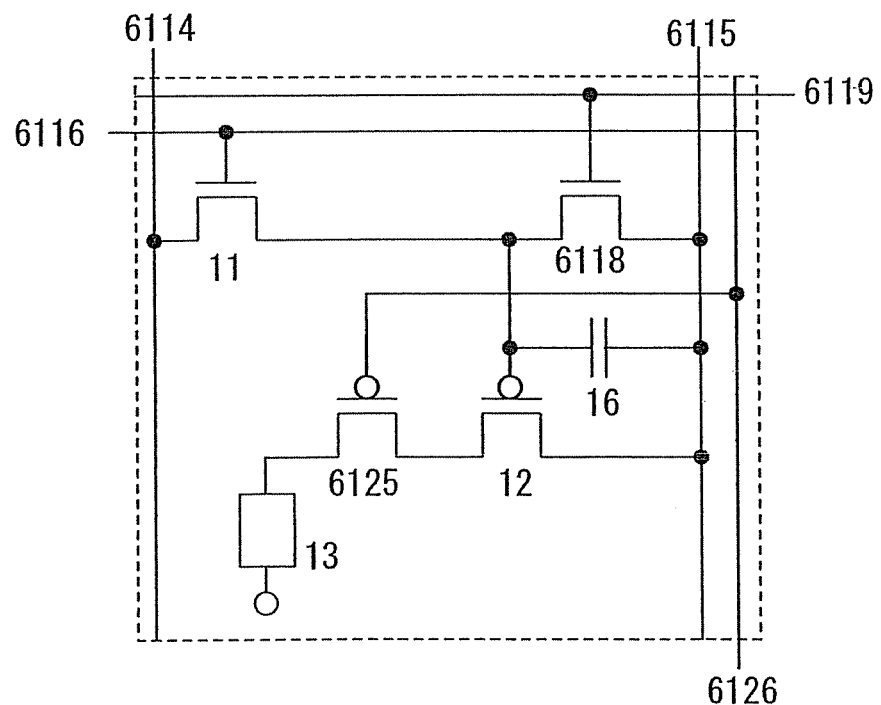

FIG. 13B is an equivalent circuit diagram of a pixel where a transistor 6125 and a wiring 6126 are additionally provided in the pixel shown in FIG. 13A. A gate potential of the transistor 6125 is fixed by the wiring 6126. In addition, the transistor 12 is connected in serried to the transistor 6125 between the power supply line 6115 and the light emitting element 13. In FIG. 13B, the transistor 6125 accordingly controls the amount of current supplied to the light emitting element 13, and the transistor 12 controls whether the current is supplied or not to the light emitting element 13.

Equivalent circuits of the pixels shown hereinabove in FIGS. 13A and 13B can be driven by a digital method.

Figure 14:
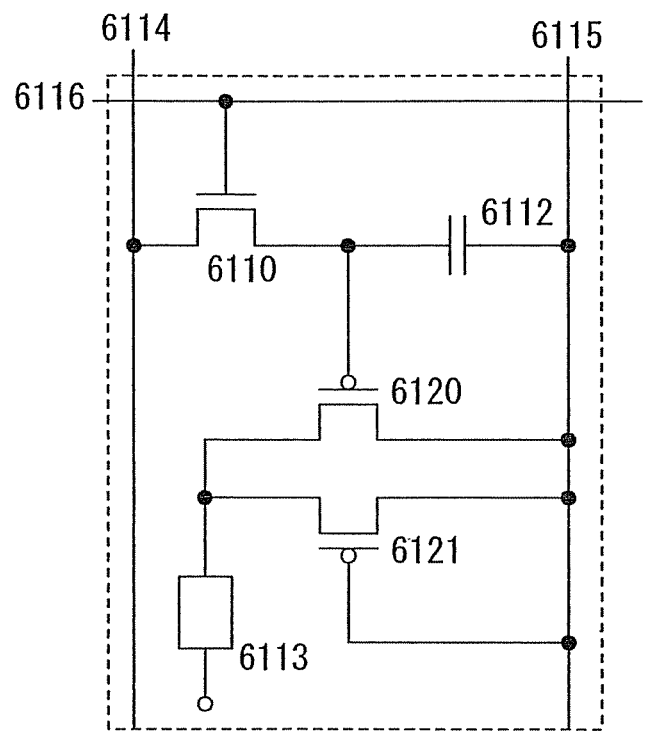
FIG. 14 shows a pixel circuit to be applied to a light emitting device of the present invention.

An equivalent circuit of a pixel shown in FIG. 14 can be driven by either a digital method or an analog method. In FIG. 14, a signal line 6114, a power supply line 6115, and a scanning line 6116, and a light emitting element 6113, transistors 6110, 6120, and 6121, and a capacitor element 6112 in a region within the signal line 6114, the power supply line 6115, and the scanning line 6116 are provided. In FIG. 14, the transistors 6120 and 6121 constitute a current mirror circuit and are p-type transistors. In such a circuit, in the case of employing the digital method, a digital video signal is inputted from the signal line 6114 and the amount of current supplied to the light emitting element 6113 is controlled by a time gray scale method. In the case of employing the analog method, an analog video signal is inputted from the signal line 6114 and the amount of current supplied to the light emitting element 6113 is controlled in accordance with the value of the signal.

Even in the case of a pixel circuit to which the digital method or the analog method can thus be applied, a forward voltage application period and a reverse voltage application period can be provided in one frame for aging drive or the like as described in the above embodiment mode and shown in FIGS. 1A and 1B.

In other words, a driving method in which reverse voltage and forward voltage are applied can be employed without being limited by the pixel structure. In addition, the aging drive can also be employed without being limited by the pixel structure.

This embodiment mode can be freely combined with the above-described embodiment mode.

Embodiment Mode 7

Figure 11A:
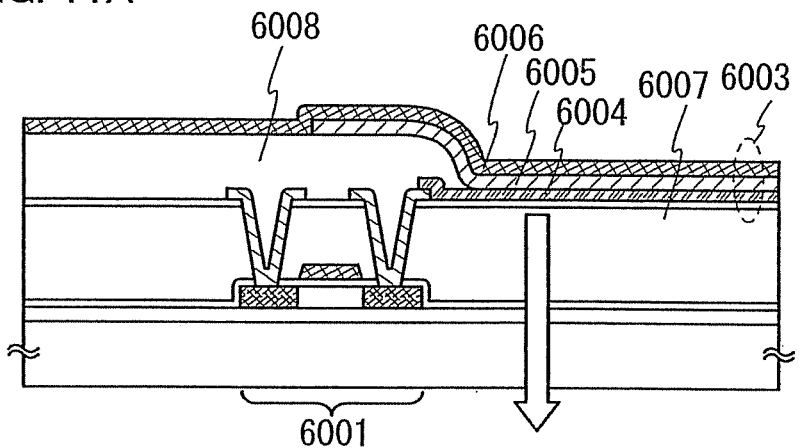
FIGS. 11A to 11C are cross-sectional views of a pixel portion in a light emitting device of the present invention.
Figure 11B:
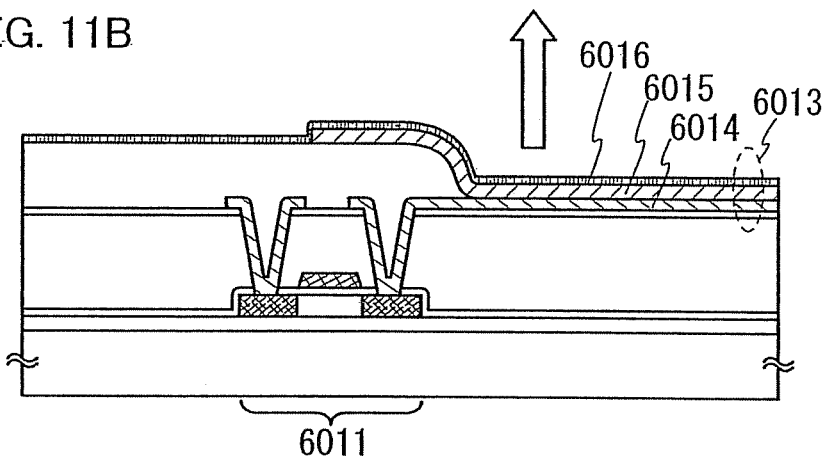
Figure 11C:
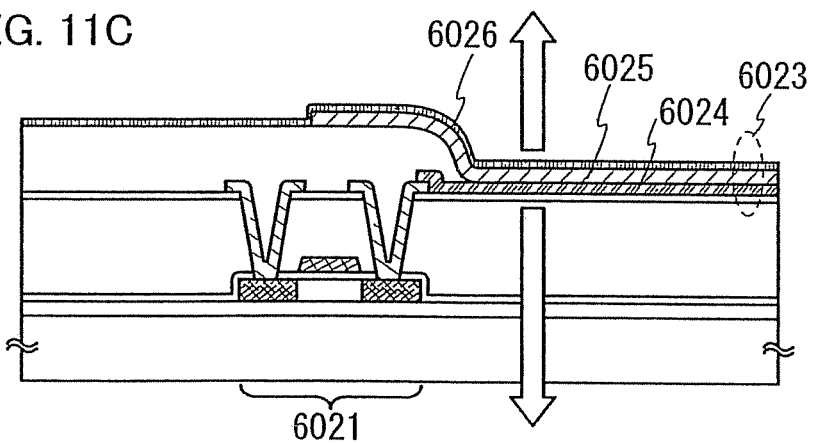

A cross-sectional structure of a pixel including a light emitting element is explained in this embodiment mode. A cross-sectional structure of a pixel in the case where a driver transistor for controlling current supply to a light emitting element as described above is a p-type thin film transistor (TFT) is described with reference to FIGS. 11A to 11C. In the invention, one of two electrodes, an anode and a cathode included in the light emitting element, whose potential can be controlled by a transistor is referred to as a first electrode and the other is referred to as a second electrode. FIGS. 11A to 11C show the case where the first electrode is an anode and the second electrode is a cathode; however, the first electrode may be a cathode and the second electrode may be an anode.

FIG. 11A is a cross-sectional view of a pixel in the case where a TFT 6001 is a p-type and light emitted from a light emitting element 6003 is extracted through a first electrode 6004. In FIG. 11A, the first electrode 6004 of the light emitting element 6003 is electrically connected to the TFT 6001.

The TFT 6001 is covered with an interlayer insulating film 6007, and a bank 6008 having an opening is formed over the interlayer insulating film 6007. The first electrode 6004 is partially exposed in the opening of the bank 6008, and the first electrode 6004, an electroluminescent layer 6005, and a second electrode 6006 are sequentially laminated in the opening. The electroluminescent layer 6005 corresponds to the first layer 3111, the second layer 3112, and the third layer 3113 in FIG. 10.

The interlayer insulating film 6007 can be formed using an organic resin film, an inorganic insulating film, or an insulating film including a Si—O—Si bond, which is formed from a siloxane-based material (hereinafter referred to as a siloxane-based insulating film). Note that siloxane has a skeleton formed by the bond of silicon (Si) and oxygen (O). An organic group containing at least hydrogen (such as an alkyl group or aromatic hydrocarbon) is used as a substituent. Further, a fluoro group may be used as a substituent. In addition, an organic group containing at least hydrogen and a fluoro group may be used as a substituent. A material referred to as a low dielectric constant material (low-k material) may be used for the interlayer insulating film 6007.

The bank 6008 can be formed using an organic resin film, an inorganic insulating film, or a siloxane-based insulating film. For example, acrylic, polyimide, polyamide, or the like can be used for the organic resin film, and silicon oxide, silicon nitride oxide, or the like can be used for the inorganic insulating film. In particular, a photosensitive organic resin film is used for the bank 6008, an opening is formed in the bank 6008, and over the first electrode 6004, and the side of the bank is formed to have an inclined surface with a continuous curvature. Consequently, the first electrode 6004 and the second electrode 6006 can be prevented from connecting to each other.

The first electrode 6004 is formed using a light transmitting material or with such a thickness as to transmit light, and is formed using a material appropriate for an anode. The above embodiment mode, can be referred to for specific materials. Note that, when a material other than a light transmitting material is used, the first electrode 6004 is formed to have such a thickness as to transmit light (preferably, approximately 5 nm to 30 nm).

The second electrode 6006 can be formed using a light reflecting or shielding material or with such a thickness as to reflect or shield light, and can be formed using metal, an alloy, a conductive compound, a mixture thereof, or the like which has a low work function. The above embodiment mode can be referred to for specific materials.

In the pixel shown in FIG. 11A, light emitted from the light emitting element 6003 can be extracted through the first electrode 6004 as shown by the outline arrow.

Next, FIG. 11B is a cross-sectional view of a pixel in the case where a TFT 6011 is a p-type and light emitted from a light emitting element 6013 is extracted through a second electrode 6016. In FIG. 11B, a first electrode 6014 of the light emitting element 6013 is electrically connected to the TFT 6011. In addition, an electroluminescent layer 6015 and the second electrode 6016 are sequentially laminated over the first electrode 6014.

The first electrode 6014 is formed using a light reflecting or shielding material or with such a thickness as to reflect or shield light, and is formed using a material appropriate for an anode. It can be formed using a similar material to that of the second electrode shown in FIG. 11A.

The second electrode 6016 can be formed using a light transmitting material or with such a thickness as to transmit light, and can be formed using metal, an alloy, a conductive compound, a mixture thereof, or the like which has a low work function. It can be formed using a similar material to that of the first electrode shown in FIG. 11A.

The electroluminescent layer 6015 can be formed as is the case with the electroluminescent layer 6005 in FIG. 11A.

In the pixel shown in FIG. 11B, light emitted from the light emitting element 6013 can be extracted through the second electrode 6016 as shown by the outline arrow.

Next, FIG. 11C is a cross-sectional view of a pixel in the case where a TFT 6021 is a p-type and light emitted from a light emitting element 6023 is extracted through a first electrode 6024 and a second electrode 6026. In FIG. 11C, the first electrode 6024 of the light emitting element 6023 is electrically connected to the TFT 6021. In addition, an electroluminescent layer 6025 and the second electrode 6026 are sequentially laminated over the first electrode 6024.

The first electrode 6024 can be formed as is the case with the first electrode 6004 in FIG. 11A. The second electrode 6026 can be formed as is the case with the second electrode 6016 in FIG. 11B. The electroluminescent layer 6025 can be formed as is the case with the electroluminescent layer 6005 in FIG. 11A.

In the pixel shown in FIG. 11C, light emitted from the light emitting element 6023 can be extracted through the first electrode 6024 and the second electrode 6026 as shown by the outline arrow.

This embodiment mode can be freely combined with the above embodiment mode.

Embodiment Mode 8

Figure 12A:
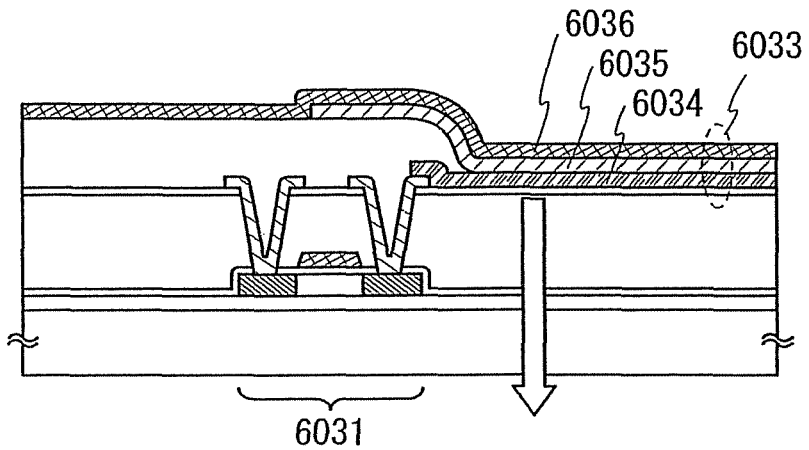
FIGS. 12A to 12C are cross-sectional views of a pixel portion in a light emitting device of the present invention.
Figure 12B:
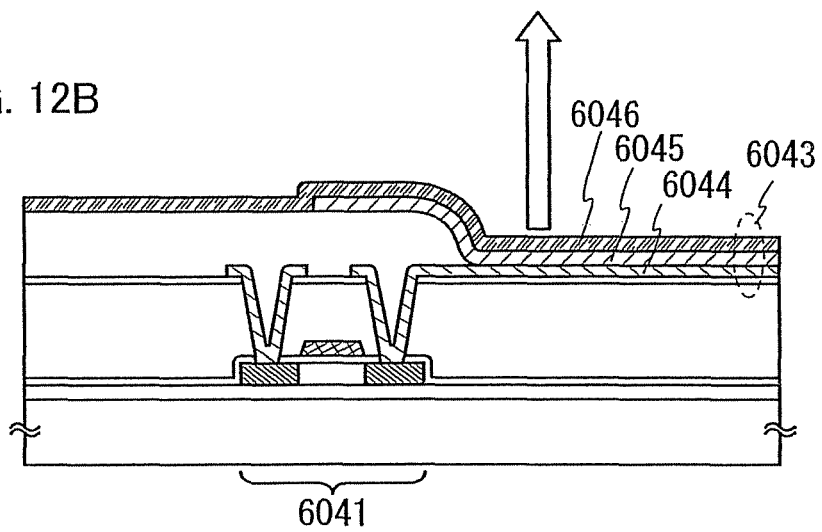
Figure 12C:
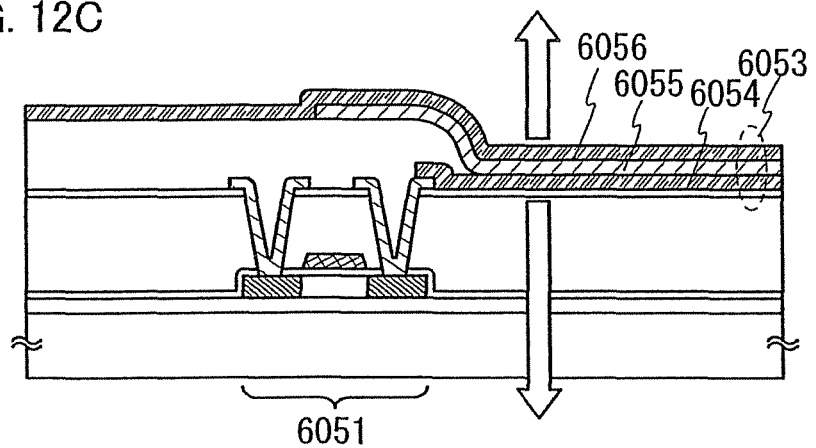

A cross-sectional structure of a pixel in the case where a transistor for controlling current supply to a light emitting element is an n-type TFT is described in this embodiment mode with reference to FIGS. 12A to 12C. Note that FIGS. 12A to 12C show the case where the first electrode is a cathode and the second electrode is an anode; however, the first electrode may be an anode and the second electrode may be a cathode.

FIG. 12A is a cross-sectional view of a pixel in the case where a TFT 6031 is an n-type and light emitted from a light emitting element 6033 is extracted through a first electrode 6034. In FIG. 12A, the first electrode 6034 of the light emitting element 6033 is electrically connected to the TFT 6031. In addition, an electroluminescent layer 6035 and a second electrode 6036 are sequentially laminated over the first electrode 6034.

The first electrode 6034 can be formed using a light transmitting material or with such a thickness as to transmit light, and can be formed using metal, an alloy, a conductive compound, a mixture thereof, or the like which has a low work function. The above embodiment mode can be referred to for specific materials.

The second electrode 6036 is formed using a light reflecting or shielding material or with such a thickness as to reflect or shield light, and is formed using a material appropriate for an anode. The above embodiment mode can be referred to for specific materials.

The electroluminescent layer 6035 can be formed as is the case with the electroluminescent layer 6005 in FIG. 11A. When the electroluminescent layer 6035 has any of a hole injecting layer, a hole transporting layer, an electron transporting layer, and an electron injecting layer in addition to a light emitting layer, the electron injecting layer, the electron transporting layer, the light emitting layer, the hole transporting layer, and the hole injecting layer are sequentially laminated over the first electrode 6034, In the case of the pixel shown in FIG. 12A, light emitted from the light emitting element 6033 can be extracted through the first electrode 6034 as shown by the outline arrow.

Next, FIG. 12B is a cross-sectional view of a pixel in the case where a TFT 6041 is an n-type and light emitted from a light emitting element 6043 is extracted through a second electrode 6046. In FIG. 12B, a first electrode 6044 of the light emitting element 6043 is electrically connected to the TFT 6041. In addition, an electroluminescent layer 6045 and the second electrode 6046 are sequentially laminated over the first electrode 6044.

The first electrode 6044 is formed using a light reflecting or shielding material or with such a thickness as to reflect or shield light, and can be formed using metal, an alloy, a conductive compound, a mixture thereof, or the like which has a low work function. The above embodiment mode can be referred to for specific materials.

The second electrode 6046 is formed using a light transmitting material or with such a thickness as to transmit light, and is formed using a material appropriate for an anode. The above embodiment mode can be referred to for specific materials. Note that, when a material other than a light transmitting conductive oxide material is used, the second electrode 6046 is formed to have such a thickness as to transmit light (preferably, approximately 5 nm to 30 nm).

The electroluminescent layer 6045 can be formed as is the case with the electroluminescent layer 6035 in FIG. 12A.

In the pixel shown in FIG. 12B, light emitted from the light emitting element 6043 can be extracted through the second electrode 6046 as shown by the outline arrow.

Next, FIG. 12C is a cross-sectional view of a pixel in the case where a TFT 6051 is an n-type and light emitted from a light emitting element 6053 is extracted through a first electrode 6054 and a second electrode 6056. In FIG. 12C, the first electrode 6054 of the light emitting element 6053 is electrically connected to the TFT 6051. In addition, an electroluminescent layer 6055 and the second electrode 6056 are sequentially laminated over the first electrode 6054.

The first electrode 6054 can be formed as is the case with the first electrode 6034 in FIG. 12A. The second electrode 6056 can be formed as is the case with the second electrode 6046 in FIG. 12B. The electroluminescent layer 6055 can be formed as is the case with the electroluminescent layer 6035 in FIG. 12A.

In the pixel shown in FIG. 12C, light emitted from the light emitting element 6053 can be extracted through the first electrode 6054 and the second electrode 6056 as shown by the outline arrow.

This embodiment mode can be freely combined with the above embodiment mode.

Embodiment Mode 9

Examples of electronic devices each provided with the light emitting device of the invention can be given as follows: a television device (also simply referred to as a television or a television receiver), a digital camera, a digital video camera, a cellular phone device (also simply referred to as a cellular phone or a cell-phone), a portable information terminal such as a PDA, a portable game machine, a computer monitor, a computer, an audio reproducing device such as car audio, an image reproducing device including a recording medium such as a home-use game machine, and the like. Practical examples thereof are hereinafter explained with reference to FIGS. 21A to 21F.

Figure 21A:
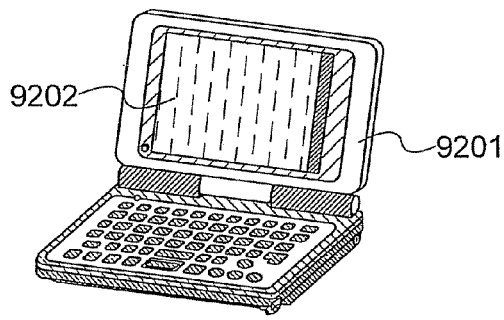
FIGS. 21A to 21F show electronic devices equipped with a light emitting device of the present invention.

A portable information terminal shown in FIG. 21A includes a main body 9201, a display portion 9202, and the like. The display portion 9202 can employ the light emitting device of the invention. Accordingly, it is possible to provide a portable information terminal with high stability due to a uniformed deterioration state and improved image quality due to reduction in variation of deterioration over time.

Figure 21B:
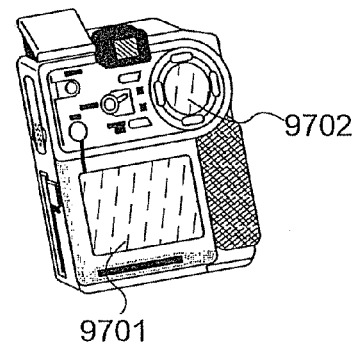

A digital video camera shown in FIG. 21B includes a display portion 9701, a display portion 9702, and the like. The display portion 9701 and the display portion 9702 can employ the light emitting device of the invention. Accordingly, it is possible to provide a digital video camera with high stability due to a uniformed deterioration state and improved image quality due to reduction in variation of deterioration over time.

Figure 21C:
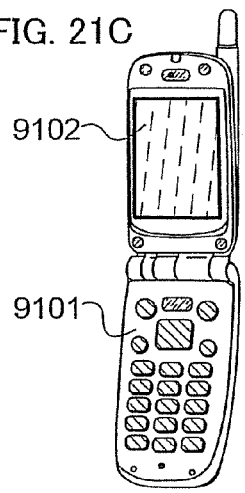

A cellular phone shown in FIG. 21C includes a main body 9101, a display portion 9102, and the like. The display portion 9102 can employ the light emitting device of the invention. Accordingly, it is possible to provide a cellular phone with high stability due to a uniformed deterioration state and improved image quality due to reduction in variation of deterioration over time.

Figure 21D:
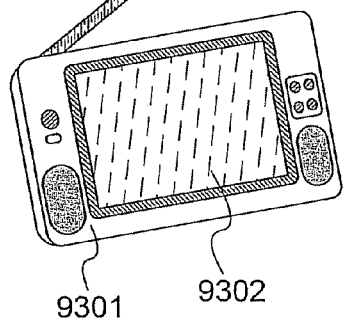

A portable television device shown in FIG. 21D includes a main body 9301, a display portion 9302, and the like. The display portion 9302 can employ the light emitting device of the invention. Accordingly, it is possible to provide a portable television device with high stability due to a uniformed deterioration state and improved image quality due to reduction in variation of deterioration over time. In addition, the light emitting device of the invention can be applied to a wide range of television devices ranging from a small television device mounted on a portable terminal such as a cellular phone, a medium television device which is portable, to a large (for example, 40-inch or larger) television device.

Figure 21E:
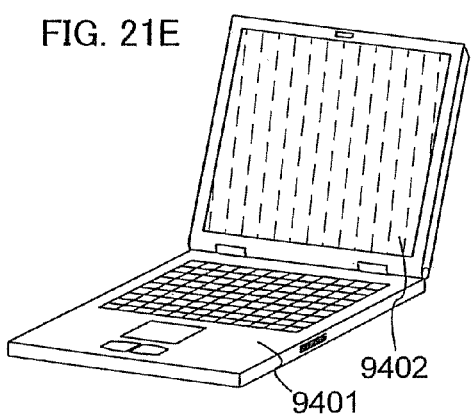

A portable computer shown in FIG. 21E includes a main body 9401, a display portion 9402, and the like. The display portion 9402 can employ the light emitting device of the invention. Accordingly, it is possible to provide a portable computer with high stability due to a uniformed deterioration state and improved image quality due to reduction in variation of deterioration over time.

Figure 21F:
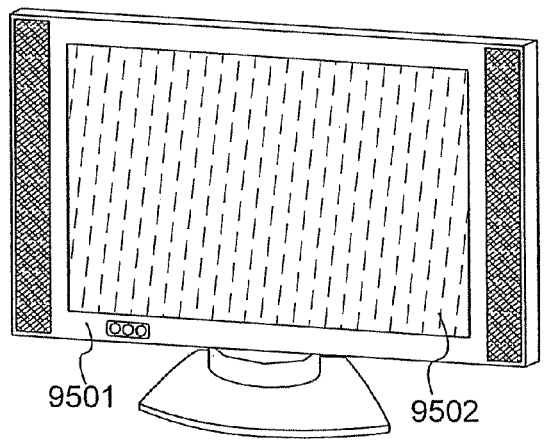

A television device shown in FIG. 21F includes a main body 9501, a display portion 9502, and the like. The display portion 9502 can employ the light emitting device of the invention. Accordingly, it is possible to provide a television device with high stability due to a uniformed deterioration state and improved image quality due to reduction in variation of deterioration over time.

Thus, according to the light emitting device of the invention, it is possible to provide an electronic device with high stability due to a uniformed deterioration state and improved image quality due to reduction in variation of deterioration over time.

Embodiment Mode 10

An example of completing a cellular phone 900 equipped with the display panel described in the above embodiment mode is described in this embodiment mode.

Figure 22:
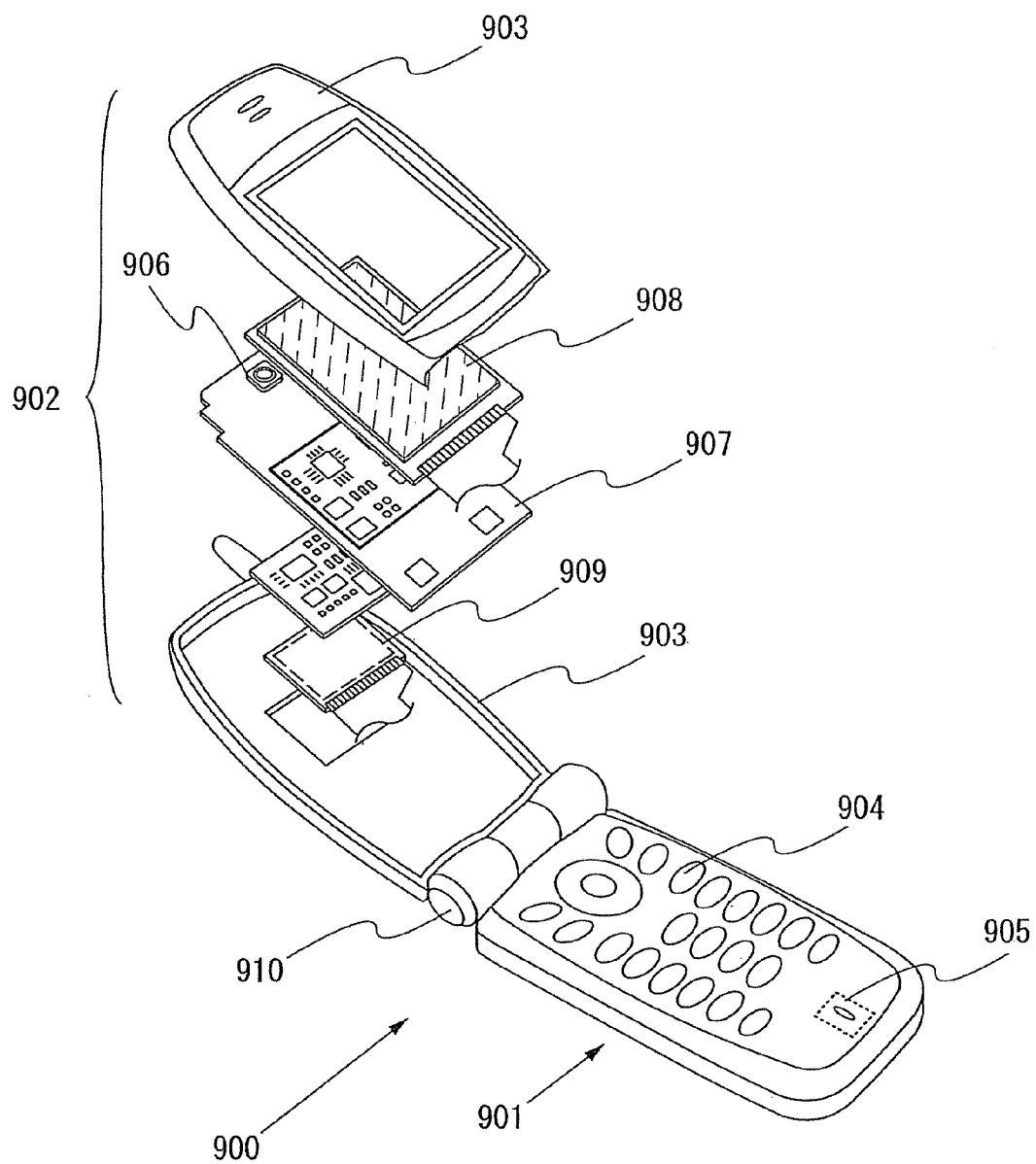
FIG. 22 shows a cellular phone equipped with a light emitting device of the present invention.

In the cellular phone 900 shown in FIG. 22, a main body (A) 901 including operation switches 904, a microphone 905, and the like is connected with a hinge 910 to a main body (B) 902 including a display panel (A) 908, a display panel (B) 909, a loudspeaker 906, and the like so as to be openable and closable. The display panel (A) 908 and the display panel (B) 909 are placed in a chassis 903 of the main body (B) 902 together with a circuit board 907. Pixel portions of the display panel (A) 908 and the display panel (B) 909 are placed so as to be visible through an open window formed in the chassis 903.

As to the display panel (A) 908 and the display panel (B) 909, the specification such as the number of pixels can be appropriately determined in accordance with functions of the cellular phone 900. For example, the display panel (A) 908 and the display panel (B) 909 can be combined as a main screen and a sub-screen, respectively. In the case of employing a double-sided display panel which emits light in the direction of both sides, one double-sided display panel can perform display of the display panel (A) and display of the display panel (B).

At least the display panel (A) 908 is equipped with a display panel having the monitor light emitting element of the invention, and aging drive is performed before mounting the display panel on the chassis 903. Accordingly, the cellular phone provided with the display panel of the invention can obtain an effect of high stability due to a uniformed deterioration state and improved image quality due to reduction in variation of deterioration over time.

By using such a display panel, the display panel (A) 908 can be a high-definition color display screen which displays characters and images and the display panel (B) 909 can be a monochrome information display screen which displays textual information. In particular, when the display panel (B) 909 is an active matrix type with higher definition, it can display various types of textual information to improve information display density per screen. For example, when the display panel (A) 908 is a 2- to 2.5-inch QVGA (320 dots×240 dots) panel with 64 gray scale levels and 260000 colors and the display panel (B) 909 is a monochrome high-definition panel with 2 to 8 gray levels and 180 to 220 ppi, Kanji (Chinese characters), the Arabic alphabet, and the like as well as the Roman alphabet, Hiragana (Japanese cursive syllabic characters), and Katakana (Japanese angular syllabic characters) can be displayed.

The cellular phone according to this embodiment mode can be modified in various modes depending on functions or applications thereof. For example, it may be a camera-equipped cellular phone by implementing an imaging element in the hinge 910. Even when the operation switches 904, the display panel (A) 908, and the display panel (B) 909 are placed in one chassis and integrated, the above-described effect can be obtained. Further, a similar effect can be obtained when the structure of this embodiment mode is applied to an information display terminal provided with a plurality of display portions.

EMBODIMENT

Embodiment 1

A driving method before and after mounting a light emitting module on a product, and a driver circuit for that will be specifically explained in this embodiment.

Figure 5A:
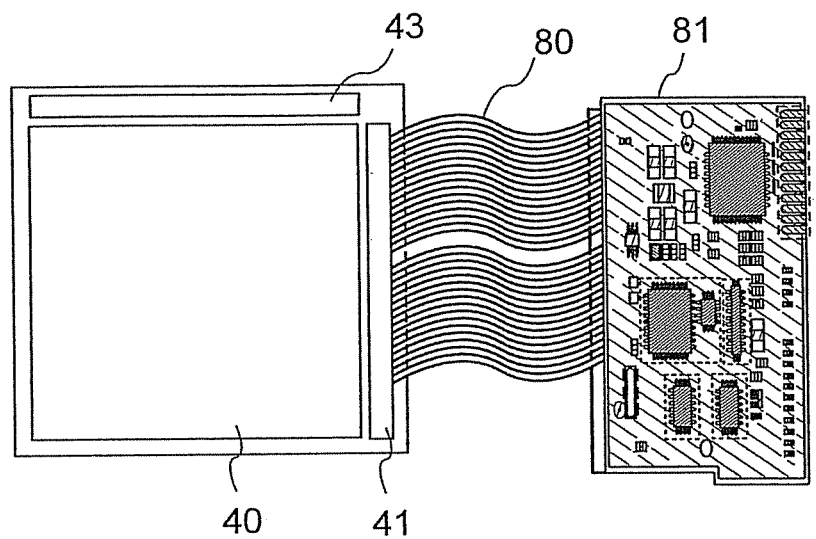
FIGS. 5A and 5B show a display panel and a driver circuit of the present invention.

As described in the above embodiment mode, a light emitting module is subjected to aging drive before mounted on a product to cause initial deterioration in a light emitting element. At this time, a reverse voltage application period is preferably provided to easily detect deterioration and defects in the light emitting element. A driver circuit 81 for performing such drive is formed over a printed board and connected to a display panel including a pixel portion 40, a signal line driver circuit 43, and a scanning line driver circuit 41 through an FPC 80 as shown in FIG. 5A.

Figure 5B:
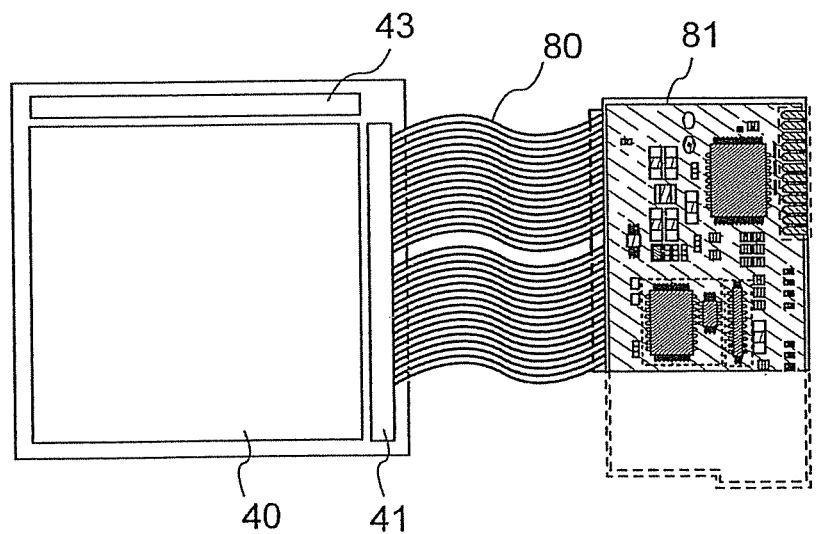

Thereafter, the driver circuit for performing aging drive is removed as shown in FIG. 5B before incorporating the light emitting module in a chassis of an end product. In particular, the driver circuit for applying reverse voltage in the aging drive is preferably removed. In this embodiment, the driver circuit is removed by cutting the printed board. Naturally, the driver circuit may be detached from the printed board.

The driver circuit as described above may be integrated with the pixel portion over the substrate. In that case, the driver circuit can be removed by cutting the substrate by scribing or dicing.

The driver circuit as described above may be reused for a plurality of light emitting modules. In this case, the driver circuit may be placed in an aging chamber and connected to a light emitting module through a terminal, and the aging drive may be performed only on the spot.

In addition, the driver circuit as described above may remain mounted on a panel. It can be mounted without inputting a signal to the driver circuit and operating it.

As described above, the light emitting module is driven without applying reverse voltage after mounted on a product. Therefore, the driver circuit can be prevented from operating without being removed.

Figure 6:
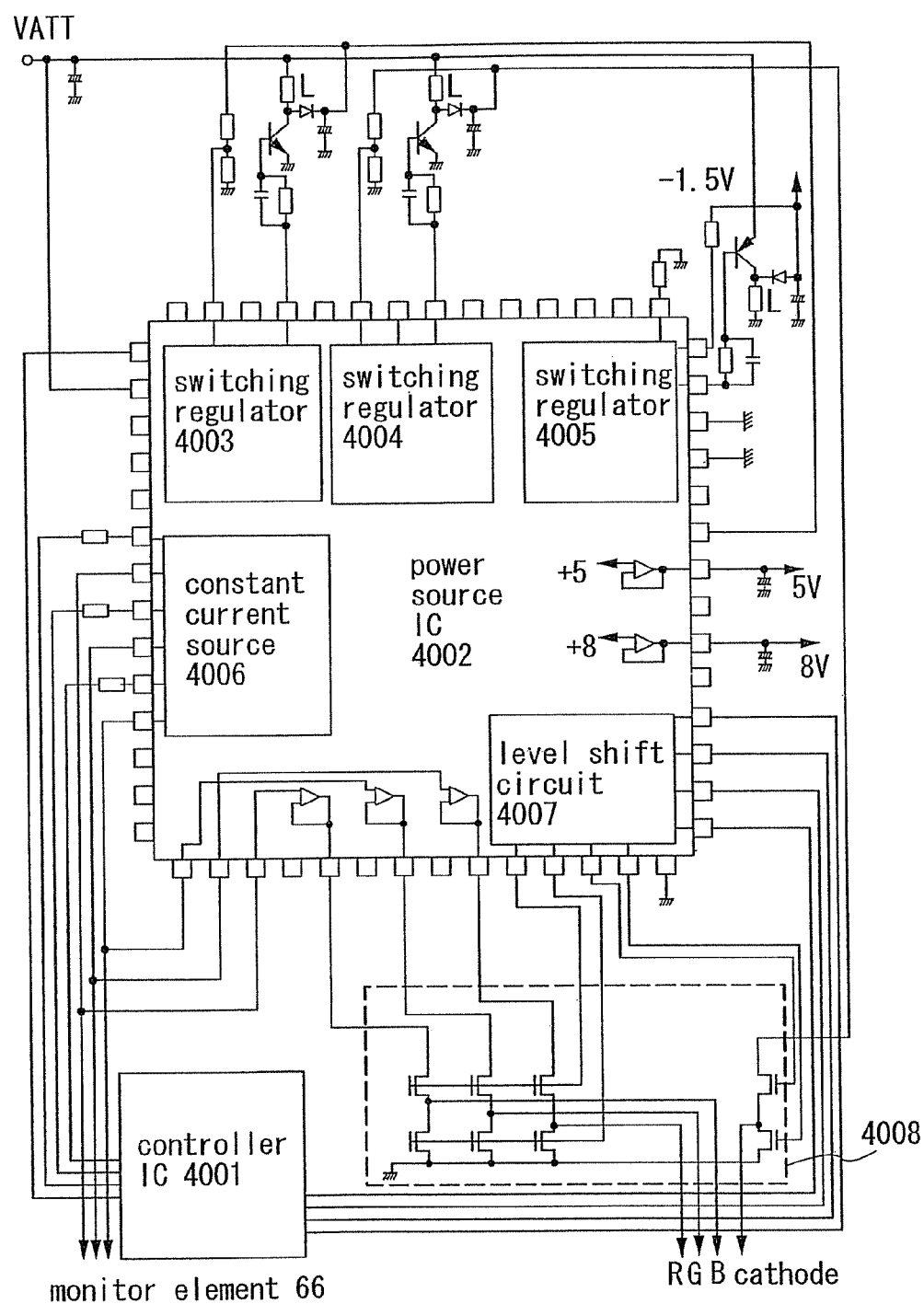
FIG. 6 is a circuit diagram showing a driver circuit of the present invention.

FIG. 6 shows a power supply system for the driver circuit. The power supply system includes a power source IC 4002 and peripheral components thereof. The power source IC includes switching regulators 4003, 4004, and 4005, operational amplifiers, a constant current source 4006, and a level shift circuit 4007. A voltage VATT from a battery is stepped up or down in the switching regulators 4003, 4004, and 4005 to be supplied to the display panel. AC drive with forward voltage and reverse voltage can be performed by stepping up a signal from a controller IC 4001 in the level shift circuit 4007 to be supplied to a switching circuit 4008.

Operation of the switching circuit 4008 is explained below. First, when forward voltage is applied to the light emitting element, current flows to an R terminal (R), a G terminal (G), and a B terminal (B) connected to each light emitting element in the display panel through switches connected to outputs of the operational amplifiers. At this time, a cathode is connected to GND. However, the cathode is not necessarily connected to GND so long as voltage high enough for the light emitting element to emit light is secured.

Next, when reverse voltage is applied to the light emitting element, the R terminal, the G terminal, and the B terminal are connected to GND through the switching circuit 4008. At this time, the cathode is connected to an output of the switching regulator 4004. Since output voltage of the switching regulator 4004 is sufficiently higher than GND, reverse voltage is applied to each light emitting element.

The AC drive as described above can be performed at the time of aging drive.

Figure 7:
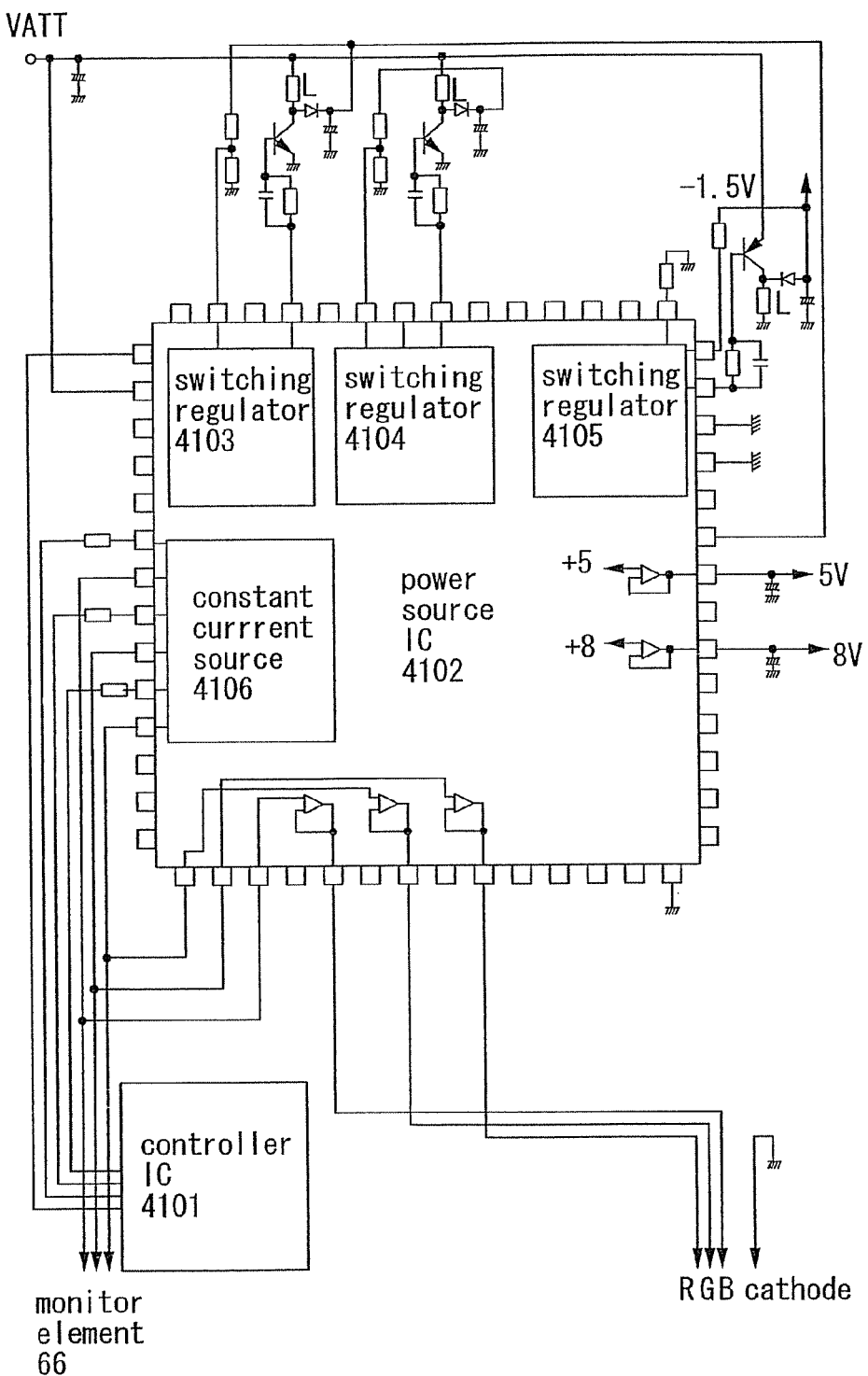
FIG. 7 is a circuit diagram showing a driver circuit of the present invention.

FIG. 7 shows a power supply system used for mounting a light emitting module on a product after aging drive. The power supply system includes a power source IC 4102 and peripheral components thereof. The power source IC includes switching regulators 4103, 4104, and 4105, operational amplifiers, and a constant current source 4106. A voltage VATT from a battery is stepped up or down in the switching regulators 4103, 4104, and 4105 to be supplied to the display panel. An R terminal, a G terminal, and a B terminal are connected to outputs of the operational amplifiers, and a cathode is connected to GND. However, the cathode is not necessarily connected to GND so long as a voltage high enough for the light emitting element to emit light is secured.

Note that the switching circuit 4008 as shown in FIG. 6 is not provided in FIG. 7. This is because, if an initial defect is removed in the aging step and a progressive defect is not generated, the AC drive need not be performed after mounting the light emitting module on a product. In particular, the light emitting element containing molybdenum oxide of the invention is thick and hard to deteriorate over time. Therefore, there is little need for providing a reverse voltage application period after mounting on a product.

Therefore, the switching circuit 4008 can be cut off or removed as described above. Accordingly, the number of components can be reduced from 38 to 30; thus, the reduction can be achieved by approximately 20%. In particular, the number of semiconductor elements such as circuits can be reduced from 14 to 6; thus, the reduction can be achieved by approximately 60%. This contributes to the reduction in component areas after mounting and the cost reduction of the components.

In addition, the level shift circuit 4007 can be removed from the power source IC 4002. This can contribute to the cost reduction of the power source IC. AC drive elements formed over the display panel and an AC driver circuit provided in the driver circuit for driving pixels remain disposed; however, it does not cause a problem since these do not contribute to the cost increase. In addition, the AC driver circuit and the like can be controlled so as not to operate after mounted on a product.

Note that the light emitting module of this embodiment may be mounted with a circuit for image shifting. This is because burn-in can be prevented by image shifting without applying reverse voltage.

Thus, a highly stable light emitting module can be manufactured in which initial deterioration is caused to uniform deterioration states. After the light emitting module is mounted on a product, a light emitting device can be provided in which deterioration over time is reduced and image quality is improved. In addition, a reduction in size and weight of the product can also be achieved since an unnecessary driver circuit can be removed. When the driver circuit is integrated with the substrate, the pixel portion can be narrowed by removing the driver circuit. Further, the driver circuit can be reused, which can contribute to the cost reduction of components.

Embodiment 2

In this embodiment, specifically explained is a structure of a light emitting device provided with a pixel portion in which the number of pixels is redundant with respect to that of display pixels, for shifting a display screen at certain intervals. In this embodiment, for example, a display panel with a resolution of QVGA (320×240=76800 pixels) is used and provided with four redundant pixels in each of row and column directions to have a resolution of 324×244=79056 pixels.

Then, the display screen is shifted at certain intervals. The shifting is performed in this embodiment at the time of applying power to the light emitting device. The display screen is preferably shifted at the time of applying power, since the display screen shifting is hard to be recognized by a user.

The shift amount may be differentiated at every power application in the range of redundant pixels. In this embodiment, four redundant pixels are provided in row and column directions; in other words, ±2 redundant pixels are provided in a row direction and ±2 redundant pixels are provided in a column direction. Therefore, the range of the shift amount of the display screen is ±2 pixels in each of row and column directions.

There are a total of 25 ways of shifting the display screen: five (−2, −1, 0, 1, 2) in a row direction and five (−2, −1, 0, 1, 2) in a column direction.

Note that the display screen shifting can be performed by altering the timing of a scan start signal (start pulse: SP).

In addition, a memory circuit or the like can record where the image has been displayed.

Even after the power application, the image can be shifted at predetermined intervals, for example, at approximately five-minute intervals, at approximately ten-minute intervals, at approximately thirty-minute intervals, at approximately one-hour intervals, or the like. The shorter the interval is, the more frequently the display time is averaged and the more greatly the effect of preventing burn-in can be obtained. However, when the interval is too short, the screen results in flickering.

When the image is thus shifted after the power application, the image is preferably shifted pixel to pixel as shown in FIGS. 9A to 9D. The image is preferably shifted pixel to pixel as described above, since the shifting is hard to be recognized by a user.

The image can be blurred by being shifted in this manner, and a rapid change in gray scale of burn-in can be reduced. This blurring effect becomes more significant, as a shift amount increases.

Embodiment 3

This embodiment describes results of cycle tests to prove that little deterioration over time occurs in a light emitting element which contains molybdenum oxide and is thicker than an element without molybdenum oxide.

Figure 15A:
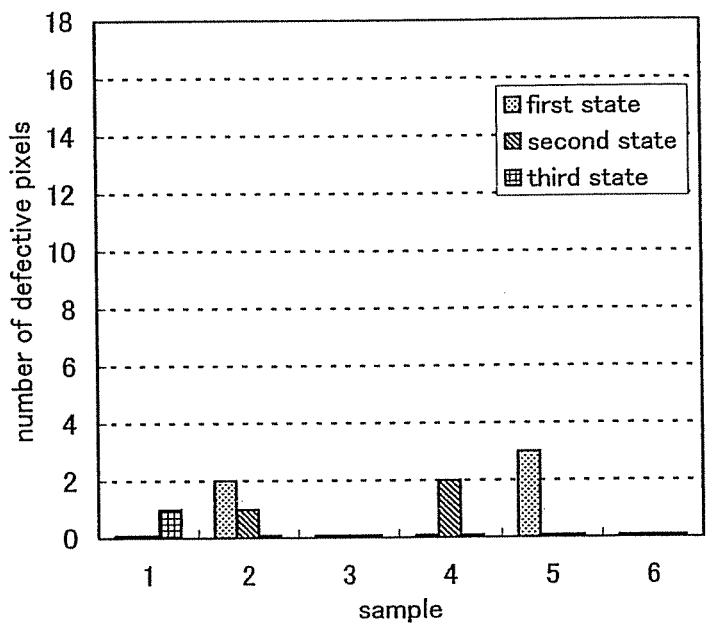
FIGS. 15A and 15B show results of cycle tests using a light emitting element of the present invention.

FIG. 15A shows results of counting the number of defective pixels before performing aging drive (a first state), after performing aging drive (a second state), and after performing drive at room temperature for 60 hours, assuming actual operation (a third state) on each of Samples 1 to 6 shown in Table 1.

[Table 1]

Correction by a monitor light emitting element as a condition in Table 1 means to correct for a current value to be supplied to the light emitting element depending on ambient temperature or the like as described in the above embodiment mode, and there are cases where the correction is conducted and not conducted. Reverse voltage application as a condition in Table 1 means to apply reverse voltage in addition to forward voltage in the aging drive and actual operation drive, and there are cases where the application is conducted and not conducted.

FIG. 15A shows that the number of defective pixels is small as a whole. Note that, in FIG. 15A, the case where the number of defective pixels is zero is represented as a line in the graph. It also shows that the number of defective pixels is not much increased even after driving for 60 hours. In particular, in Sample 4 to which reverse voltage is applied at the time of aging, the number of defective pixels is not increased but rather decreased after driving for 60 hours.

Figure 15B:
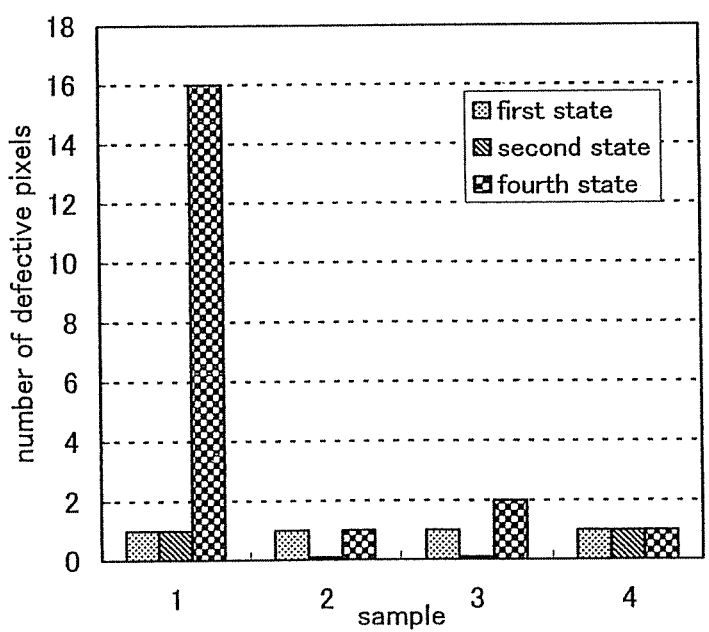

FIG. 15B shows results of performing cycle tests on Samples 1 to 4. Samples 1 to 4 are newly-manufactured samples so as to have element structures similar to those in Table 1. As to the condition of the cycle test, the temperature is changed between 85° C. and −40° C. at eight-hour intervals, and drive is performed for 64 hours, which is referred to as a fourth state.

As shown in FIG. 15B, it is found that the number of defective pixels is large in Sample 1 subjected to the cycle test, but the number of defective pixels is small as a whole. Note that, in FIG. 15B, the case where the number of defective pixels is zero is represented as a line in the graph.

Figure 30:
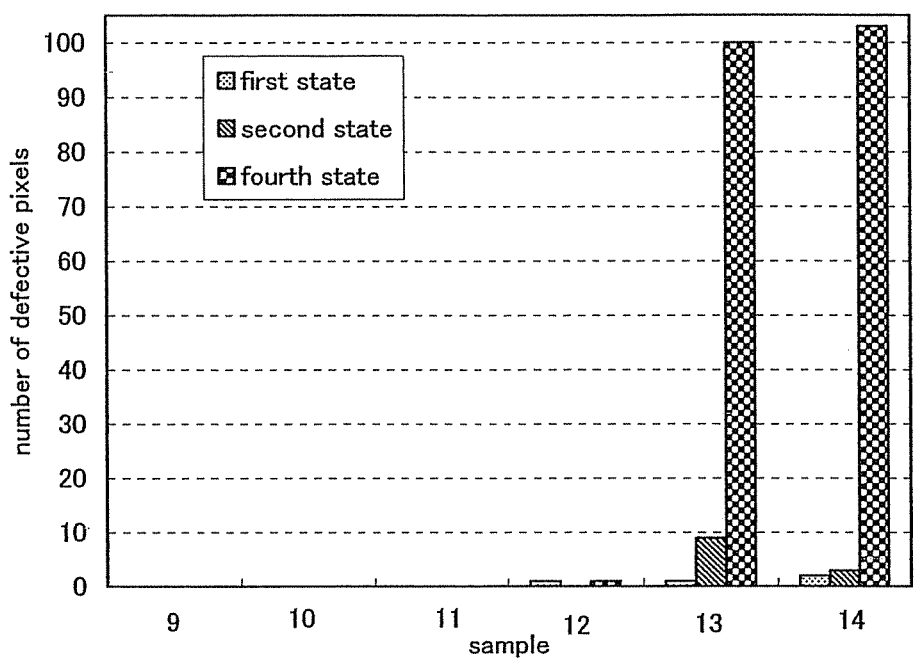
FIG. 30 shows results of a cycle test using a light emitting element of the present invention.

Next, FIG. 30 shows results of performing cycle tests on a light emitting element which does not contain molybdenum oxide and a light emitting element which contains molybdenum oxide. As to a structure of a measurement sample, Samples 9 and 10 have a structure of ITSO\α-NPB:molybdenum oxide:rubrene (composition ratio is 1:0.15:0.04 wt %) (120 nm)\α-NPB (10 nm)\Alq$_3$:coumarin (composition ratio is 1:0.01 wt %) (40 nm)\Alq$_3$ (40 nm)\lithium fluoride (LiF$_2$) (1 nm)\Al (200 nm); Samples 11 and 12, ITSO\DNTPD:molybdenum oxide:rubrene (composition ratio is 1:0.5:0.04 wt %) (120 nm)\α-NPB (10 nm)\Alq$_3$:coumarin (composition ratio is 1:0.01 wt %) (40 nm)\Alq$_3$ (40 nm)\lithium fluoride (LiF$_2$) (1 nm)\Al (200 nm); and Samples 13 and 14, ITSO\CuPc (20 nm)\α-NPB (40 nm)\Alq$_3$:coumarin (composition ratio is 1:0.01 wt %) (40 nm)\Alq$_3$ (40 nm)\lithium fluoride (LiF$_2$) (1 nm)\Al (200 nm).

As in FIG. 15, a first state means a state before aging; a second state, after aging; and a fourth state, after performing a cycle test. FIG. 30 shows that, as to the light emitting element which does not contain molybdenum oxide, the number of defects is increased in the fourth state. On the other hand, it also shows that, as to the light emitting element which contains molybdenum oxide, there is no defect or few defects in the first state, the second state, and the fourth state. Further, it shows that there is no defect or few defects because of containing molybdenum oxide even when composition of a first layer is different. Thus, the number of defective pixels can be reduced in the light emitting element of the present invention which can be thicker than a light emitting element without molybdenum oxide. Further, an increase in defects at the time of actual driving can be reduced by detecting pre-drive defects at the time of aging drive.

Figure 16:
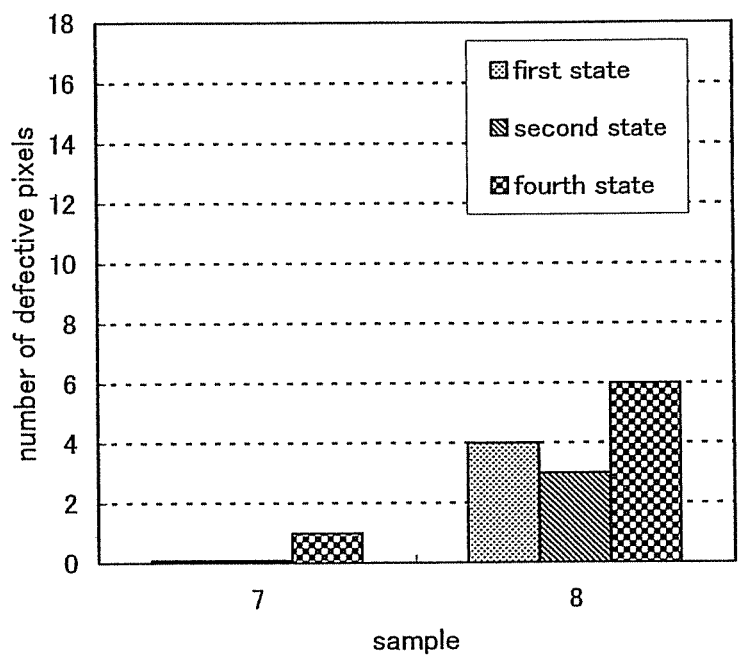
FIG. 16 shows a result of a cycle test using a light emitting element of the present invention.

Subsequently, FIG. 16 shows results of performing cycle tests on Samples 7 and 8 shown in Table 2. Sample 7 is provided with molybdenum oxide on a cathode side, and Sample 8 is also provided therewith on an anode side in addition to a cathode side.

[Table 2]

Thus, it is found that the number of defective pixels is small as a whole and molybdenum oxide is effective even when provided on a cathode side.

Embodiment 4

The relationship between thickness and drive voltage of a light emitting element is explained in this embodiment.

Figure 17:
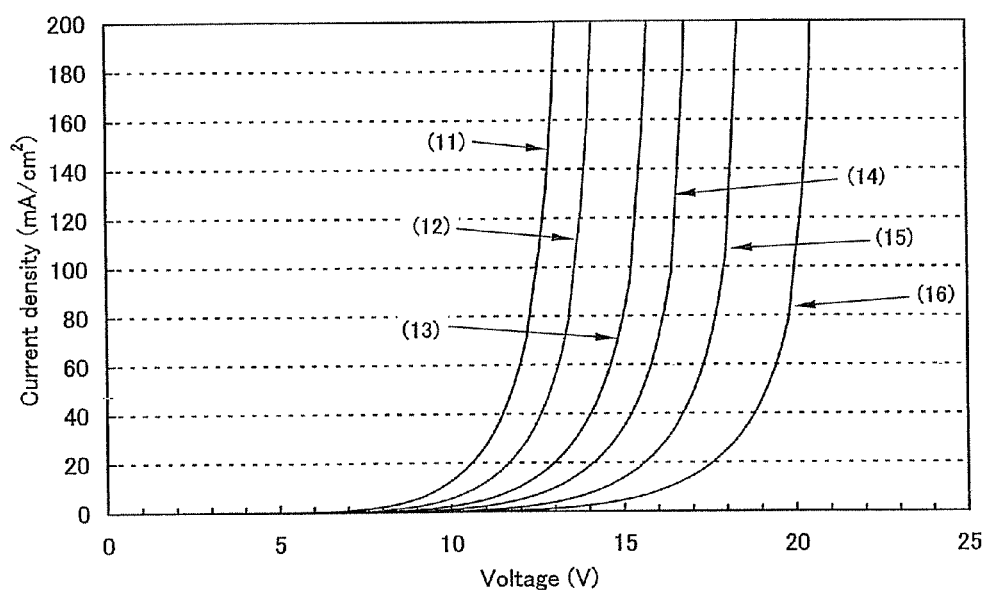
FIG. 17 shows a result indicating a relationship between thickness and drive voltage of a light emitting element.

FIG. 17 is a graph showing current density (mA/cm$^2$) to voltage (V) characteristics in the case where a thickness X of α-NPB is 60 nm (Sample 11), 80 nm (Sample 12), 100 nm (Sample 13), 120 nm (Sample 14), 140 nm (Sample 15), and 160 nm (Sample 16) in an element structure of ITO\CuPc (20 nm)\α-NPB (X nm)\Alq$_3$:DMQd (37.5 nm)\Alq$_3$ (37.5 nm)\calcium fluoride (CaF$_2$) (1 nm)\Al (200 nm). Note that ":" means that plural kinds of materials are co-evaporated using resistance heating evaporation to form a mixed layer, and "\" means that each layer is sequentially laminated from the left. The same applies hereinafter. Table 3 shows results of voltage (V) characteristics with respect to the thickness (X nm) of α-NPD.

[Table 3]

Table 3 shows that as the thickness of α-NPB is increased, the voltage is also increased. Accordingly, the drive voltage to obtain a predetermined current density is also increased as the thickness of α-NPB is increased.

Figure 18:
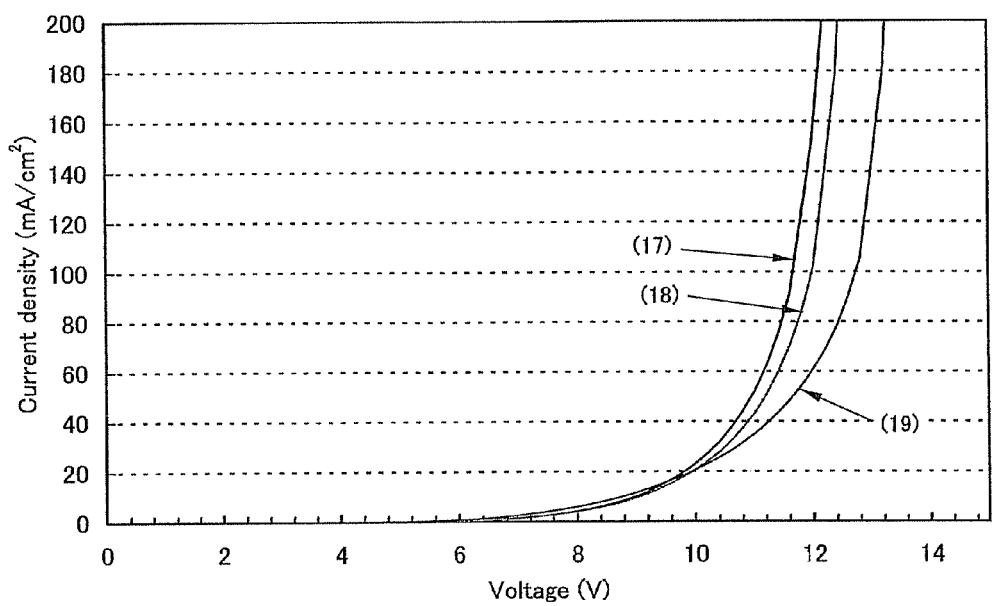
FIG. 18 shows a result indicating a relationship between thickness and drive voltage of a light emitting element.

FIG. 18 is a graph showing current density (mA/cm$^2$) to voltage (V) characteristics in the case where a thickness Y of molybdenum oxide is 20 nm (Sample 17), 50 nm (Sample 18), and 100 nm (Sample 19) in an element structure of ITO\molybdenum oxide (Y nm)\CuPc (20 nm)\α-NPB (40 nm)\Alq$_3$:DMQd (37.5 nm)\Alq$_3$ (37.5 nm)\calcium fluoride (CaF$_2$) (1 nm)\Al (200 nm). Table 4 shows results of voltage (V) characteristics with respect to the thickness (Y nm) of molybdenum oxide.

[Table 4]

Table 4 shows that as the thickness of molybdenum oxide is increased, the voltage is also increased. Accordingly, the drive voltage to obtain a predetermined current density is also increased as the thickness of molybdenum oxide is increased.

As described above, it is found that the drive voltage is increased when the thickness of the light emitting element is increased.

Figure 19:
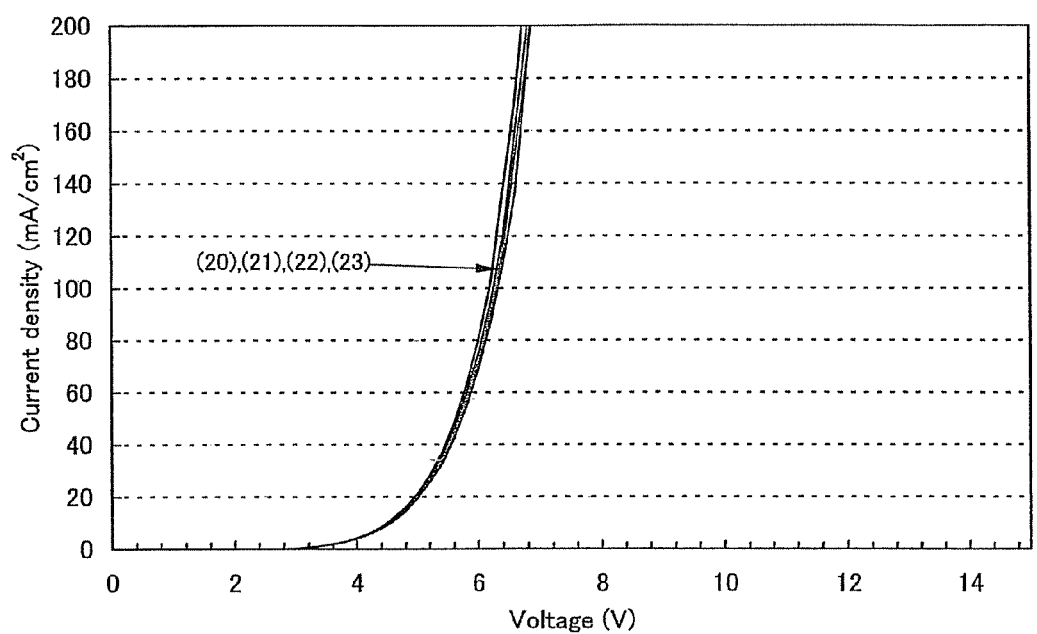
FIG. 19 shows a result indicating a relationship between thickness and drive voltage of a light emitting element of the present invention.

However, the present inventors have found that the drive voltage is not increased even when the thickness is increased, as a result of forming a layer containing an organic compound and metal oxide that is an inorganic compound. FIG. 19 is a graph showing current density (mA/cm$^2$) to voltage (V) characteristics of an element structure in which DNTPD is used as the organic compound and molybdenum oxide is used as the metal oxide, and they were co-evaporated using resistance heating evaporation to fowl a mixed layer thereof. Note that a specific element structure is ITSO\DNTPD:molybdenum oxide:rubrene (Z nm)\α-NPB (10 nm)\Alq$_3$:coumarin 6 (37.5 nm)\Alq$_3$ (37.5 nm)\LiF (1 nm)\Al (200 nm), and a thickness Z of DNTPD:molybdenum oxide:rubrene is 40 nm (Sample 20), 80 nm (Sample 21), 120 nm (Sample 22), and 160 nm (Sample 23). Note that reliability can be increased by co-evaporating rubrene. Table 5 shows results of voltage (V) characteristics with respect to the thickness (Z nm) of DNTPD:molybdenum oxide:rubrene.

[Table 5]

Table 5 shows that the voltage is not increased and maintained almost constant even when the thickness (Z nm) of DNTPD:molybdenum oxide:rubrene is increased. It is also found that the voltage itself is decreased in the element shown in FIG. 19.

Figure 27:
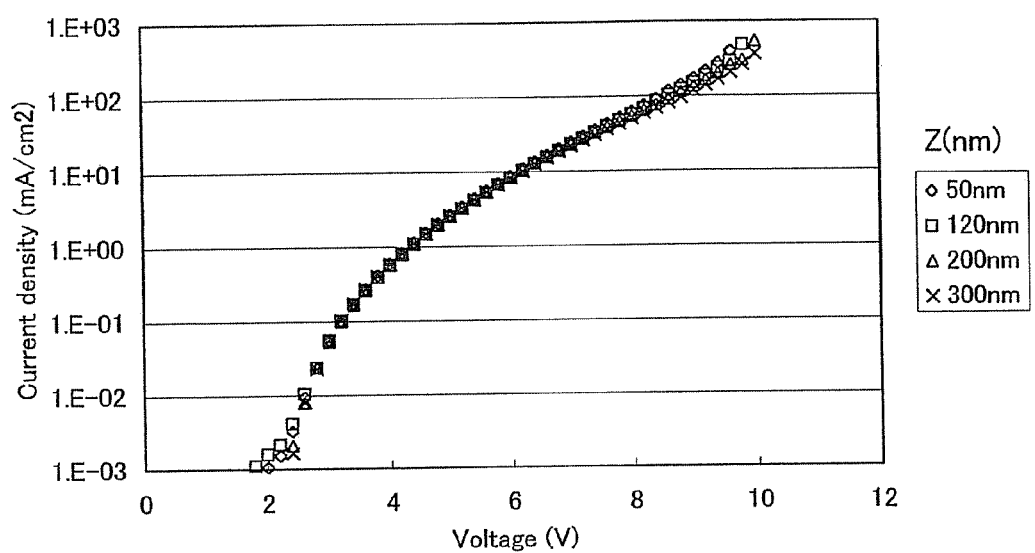
FIG. 27 shows results indicating a relationship between voltage and current density of a light emitting element of the present invention.

FIG. 27 shows current density to voltage when an element structure similar to that shown in FIG. 19 is used and a thickness Z of DNTPD: molybdenum oxide: rubrene is 50 nm, 120 nm, 200 nm, or 300 nm. Although FIG. 27 uses a current density scale different from that of FIG. 19, it also shows that the voltage is not increased and maintained almost constant even when the thickness (Z nm) of DNTPD:molybdenum oxide:rubrene is increased.

Figure 28:
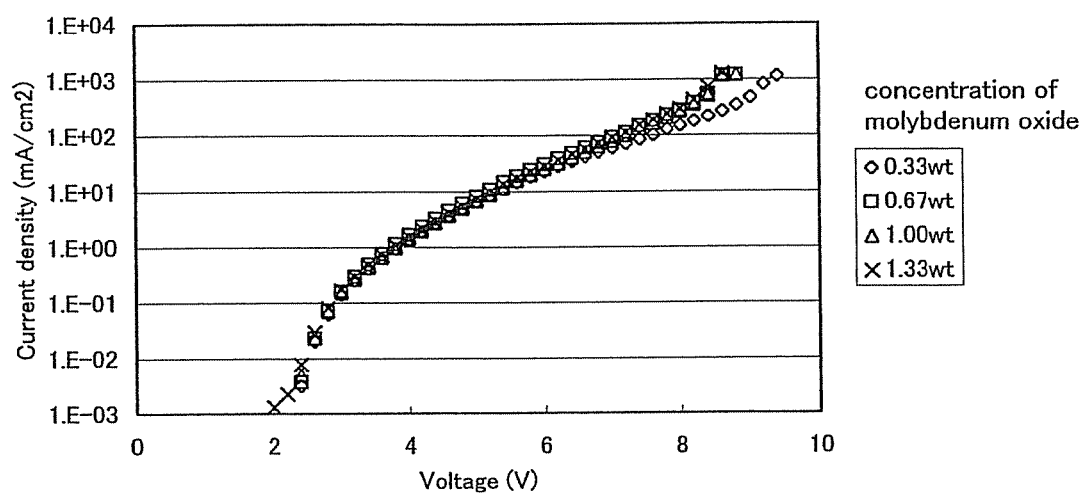
FIG. 28 shows results indicating a relationship between molybdenum oxide concentration and current density of a light emitting element of the present invention.

FIG. 28 shows current density to voltage when the thickness (Z nm) of DNTPD:molybdenum oxide:rubrene is 120 nm and the concentration of molybdenum oxide is differentiated. When DNTPD: molybdenum oxide:rubrene=1 wt %: Q wt %: 0.02 wt %, the concentration Q of molybdenum oxide is set at 0.33, 0.67, 1.00, or 1.33. Almost the same behavior is shown at every concentration, but it is found that, when voltage is increased, current density is decreased as the concentration of molybdenum oxide is increased. FIGS. 17 to 19 show results of an experiment to find the relationship between the thickness of the layer containing the organic compound and the metal oxide, and the drive voltage, and the present invention is not limited to the above element structures.

Figure 29:
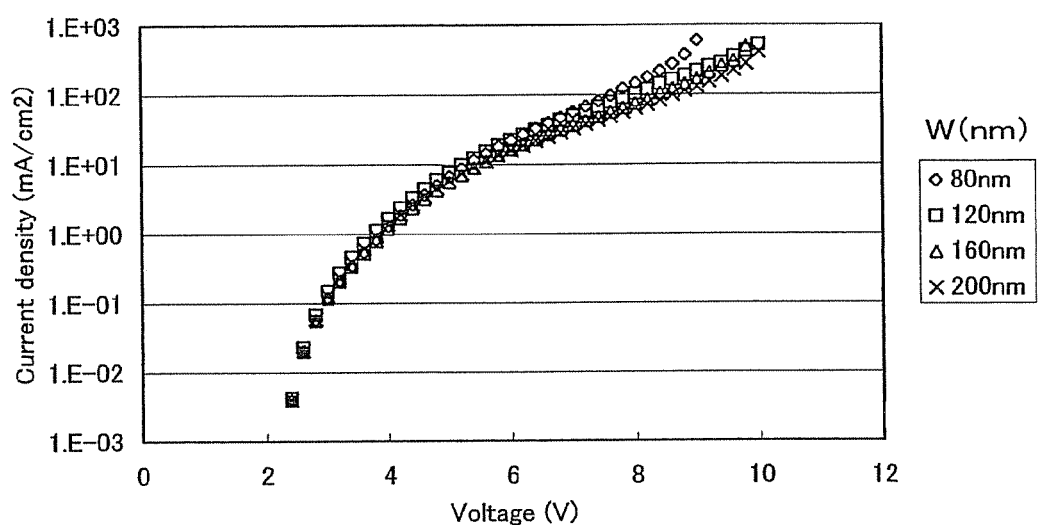
FIG. 29 shows results indicating a relationship between voltage and current density of a light emitting element of the present invention.

Further, FIG. 29 shows current density to voltage when a thickness W of rubrene is 80 nm, 120 nm, 160 nm, and 200 nm in an element which includes a light emitting layer similar to the element structure shown in FIG. 17 and uses an organic compound and molybdenum oxide as metal oxide, specifically, an element having a structure of ITSO\DNTPD:molybdenum oxide:rubrene (W nm)\α-NPB (10 nm)\Alq$_3$:DMQd (40 nm)\Alq$_3$ (40 nm)\lithium fluoride (LiF) (1 nm)\Al (200 nm). Almost the same behavior is shown with every thickness. But it is found that, when voltage is increased, current density is decreased as the thickness of DNTPD:molybdenum oxide:rubrene is increased.

Lower power consumption can be achieved in a light emitting device using such a light emitting element in which drive voltage need not be increased even when the thickness is increased.

In addition, a short circuit between the first electrode and the second electrode can be prevented by increasing the thickness of DNTPD:molybdenum oxide:rubrene as described in this embodiment. Consequently, productivity of the light emitting device having the element structure of the invention can be increased.

Embodiment 5

In this embodiment, characteristics of molybdenum oxide that is metal oxide, α-NPD that is a highly hole transporting organic compound, and molybdenum oxide:α-NPD are examined. Each film of them is formed by an evaporation method and a film of molybdenum oxide:α-NPD is fowled by a co-evaporation method using resistance heating evaporation.

As shown in Table 6, molybdenum oxide:α-NPD, which is a mixture of molybdenum oxide and α-NPD, has a lower ionization potential than molybdenum oxide or α-NPD alone by approximately 0.1 eV to 0.2 eV. In other words, it is found that the hole injecting property is enhanced.
[Table 6]

Figure 20:
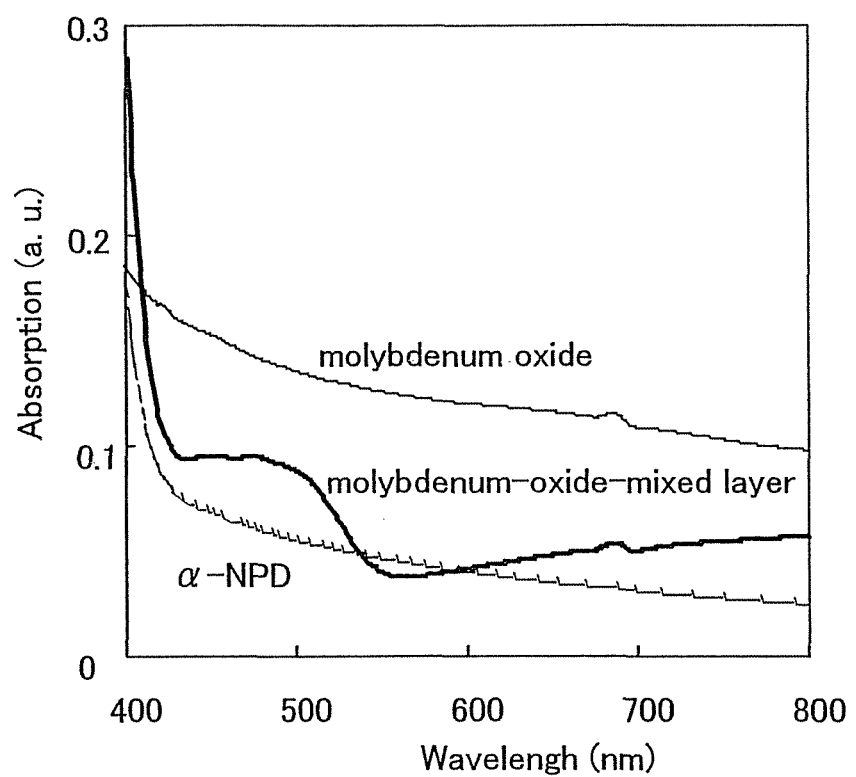
FIG. 20 shows a result indicating an absorption spectrum of a light emitting element of the present invention.

FIG. 20 shows absorption spectra of these films. In FIG. 20, each of molybdenum oxide and α-NPD does not have a characteristic peak in a visible light region. On the other hand, absorption by molybdenum oxide:α-NPD (referred to as a molybdenum-oxide-mixed layer) is more reduced than the case of molybdenum oxide alone. Thus, it is found that absorption loss of light can be more reduced by forming a light emitting element using molybdenum oxide:α-NPD than using molybdenum oxide.

In FIG. 20, molybdenum oxide:α-NPD has a new absorption peak in the proximity of 500 nm. It can be thought that this is because a charge transfer complex is formed between molybdenum oxide and α-NPD. Molybdenum oxide serves as an acceptor and α-NPD serves as a donor. Note that it is confirmed that an amine-based compound such as DNTPD as well as α-NPD can serve as a donor.

According to these experimental results, it is found that a synergistic effect can be obtained by mixing an organic compound and a specific inorganic compound. This effect can not be obtained with either of them alone. Further, it is also found that molybdenum oxide that is metal oxide is preferably used as the inorganic compound.

Embodiment 6

In this embodiment, concentration of rubrene contained in a layer containing metal oxide was changed and luminance was measured after 100 hours at room temperature. Table 7 shows an element structure of the measured sample and a composition ratio (wt %) of rubrene. In the measured sample, ITSO was used for a first electrode and Al was used for a second electrode.
[Table 7]

Figure 23:
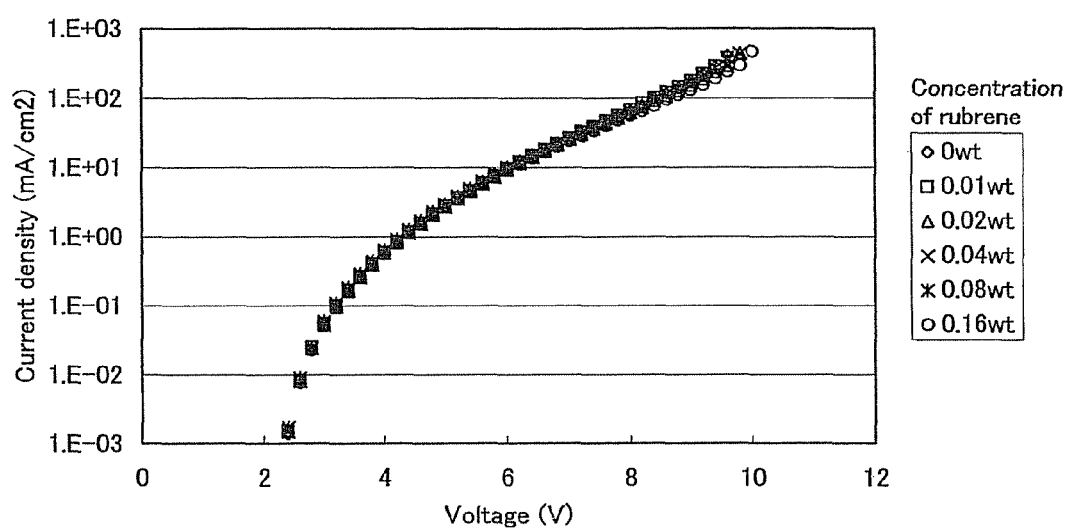
FIG. 23 shows results indicating a relationship between voltage and current density of a light emitting element of the present invention.
Figure 24:
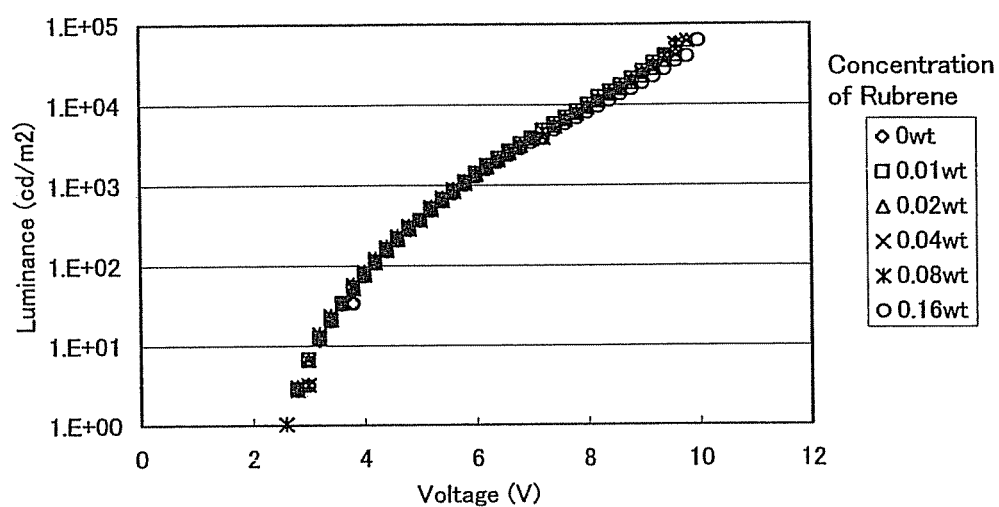
FIG. 24 shows results indicating a relationship between voltage and luminance of a light emitting element of the present invention.
Figure 25:
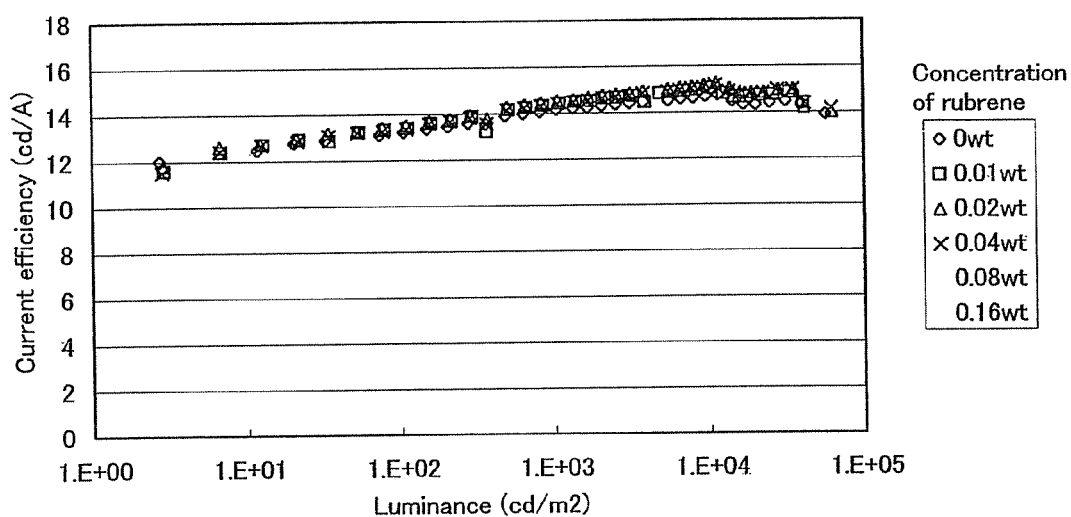
FIG. 25 shows results indicating a relationship between luminance and current efficiency of a light emitting element of the present invention.

FIGS. 23, 24, and 25 respectively show results of current density to voltage, luminance to voltage, and current efficiency to luminance in initial states of samples having rubrene concentrations shown in Table 7. As FIGS. 23, 24, and 25 show, a sample which does not contain rubrene and a sample which contains rubrene showed similar behaviors, and the effect of containing rubrene was not seen.

Figure 26:
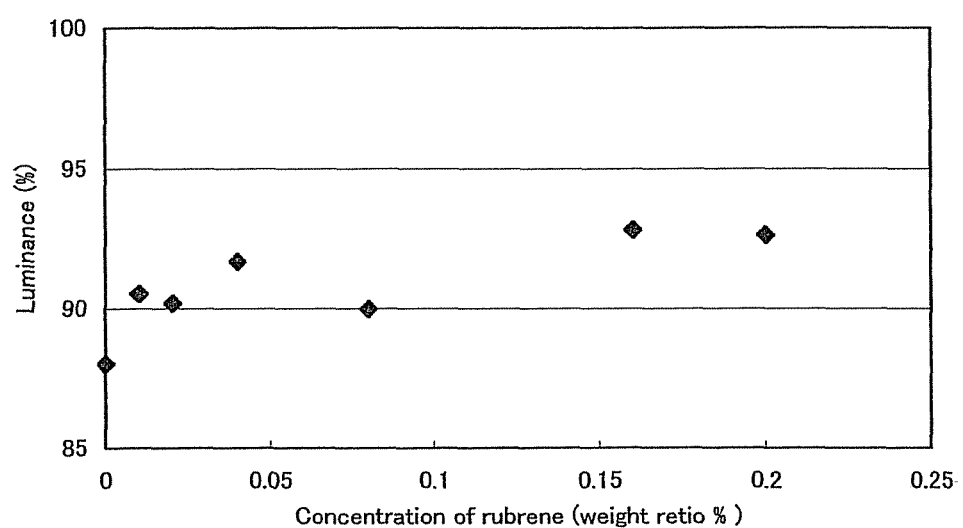
FIG. 26 shows results indicating a relationship between rubrene concentration and deterioration over time of a light emitting element of the present invention.

FIG. 26 shows rates of luminance deterioration after 100 hours at each rubrene concentration. Note that an initial luminance of this sample is 3000 cd/cm$^2$ and rates of deterioration to the initial luminance are expressed in percentage. Although luminance is deteriorated in every sample after 100 hours, it is found that a sample which contains a large amount of rubrene is less deteriorated and more reliable than a sample which contains no rubrene or a small amount of rubrene.

TABLE 1

| | | Condition | |
|---|---|---|---|
| Sample | Structure of element | Correction by monitor light emitting element | Reverse voltage application |
| 1 | α-NPB:molybdenum oxide:rubrene(120 nm)\α-NPB(10 nm)\Alq3: coumarin6(40 nm)\Alq3(30 nm)\CaF2(1 nm)\Al(200 nm) | ○ | X |
| 2 | α-NPB:molybdenum oxide:rubrene(240 nm)\α-NPB(10 nm)\Alq3: coumarin6(40 nm)\Alq3(30 nm)\CaF2(1 nm)\Al(200 nm) | ○ | X |
| 3 | α-NPB:molybdenum oxide:rubrene(120 nm)\α-NPB(10 nm)\Alq3: coumarin6(40 nm)\Alq3(30 nm)\CaF2(1 nm)\Al(200 nm) | ○ | ○ |
| 4 | α-NPB:molybdenum oxide:rubrene(240 nm)\α-NPB(10 nm)\Alq3: coumarin6(40 nm)\Alq3(30 nm)\CaF2(1 nm)\Al(200 nm) | ○ | ○ |
| 5 | α-NPB:molybdenum oxide:rubrene(120 nm)\α-NPB(10 nm)\Alq3: coumarin6(40 nm)\Alq3(30 nm)\CaF2(1 nm)\Al(200 nm) | X | X |
| 6 | α-NPB:molybdenum oxide:rubrene(240 nm)\α-NPB(10 nm)\Alq3: coumarin6(40 nm)\Alq3(30 nm)\CaF2(1 nm)\Al(200 nm) | X | X |

TABLE 2

| Sample | Structure of element | Condition | |
|---|---|---|---|
| | | Correction by monitor light emitting element | Reverse voltage application |
| 7 | CuPc(20 nm)\α-NPB(40 nm)\Alq3:coumarin6(40 nm)\Alq3(15 nm)\BzOS:Li(15 nm)\ | ○ | ○ |
| 8 | α-NPB:MoOx:rubrene (120 nm)\α-NPB(10 nm)\Alq3:coumarin6(40 nm)\Alq3(15 nm)\BzOS:Li(15 nm)\α-NPB:molybdenum oxide:rubrene (120 nm)\Al(200 nm) | ○ | ○ |

TABLE 3

| Sample | Film thickness: X (nm) | Voltage (V)*1 |
|---|---|---|
| (11) | 60 | 12.5 |
| (12) | 80 | 13.5 |
| (13) | 100 | 15.3 |
| (14) | 120 | 16.5 |
| (15) | 140 | 18.9 |
| (16) | 160 | 19.9 |

TABLE 4

| Sample | Film thickness: Y (nm) | Voltage (V)*1 |
|---|---|---|
| (17) | 20 | 11.7 |
| (18) | 50 | 11.9 |
| (19) | 100 | 12.7 |

TABLE 5

| Sample | Film thickness: Z (nm) | Voltage (V)*1 |
|---|---|---|
| (20) | 40 | 6.1 |
| (21) | 80 | 6.3 |
| (22) | 120 | 6.3 |
| (23) | 160 | 6.3 |

TABLE 6

| Film material | IP[b] (eV) |
|---|---|
| molybdenum oxide | −5.48 |
| α-NPB | −5.38 |
| molybdenum oxide:α-NPB (1:1)[a] | −5.37 |
| molybdenum oxide:α-NPB (1:0.5)[a] | −5.27 |

[a]indicates mol/mol
[b]indicates ionization potential (observed by B39AC-2)

TABLE 7

| Structure of element | DNTPD: MoOx:Rubrene | \NPB | \Alq3: coumarin 6 | \Alq3 | \LiF |
|---|---|---|---|---|---|
| Composition ratio (wt %) | (1:0.5:X) | — | (1:0.01) | — | — |
| Film thickness (nm) | 120 | 10 | 37.5 | 37.5 | 1 |

TABLE 7-continued

| Concentration of rubrene:X(wt %) |
|---|
| 0 |
| 0.01 |
| 0.02 |
| 0.04 |
| 0.08 |
| 0.16 |
| 0.2 |

What is claimed is:

1. A manufacturing method of a light emitting device comprising:
 forming a light emitting element comprising:
  forming a first electrode over a substrate;
  forming a first layer comprising molybdenum oxide and a hole transporting material over the first electrode;
  forming a second layer comprising a light emitting layer; and
  forming a second electrode over the second layer,
 applying a forward voltage to the light emitting element;
 mounting a light emitting module on the light emitting device after application of the forward voltage,
 wherein the light emitting module comprises the light emitting element.

2. A manufacturing method of a light emitting device comprising:
 forming a first light emitting element comprising:
  forming a first electrode over a substrate;
  forming a first layer comprising molybdenum oxide and a hole transporting material over the first electrode;
  forming a second layer comprising a light emitting layer; and
  forming a second electrode over the second layer,
 forming a monitor circuit comprising a second light emitting element, wherein the monitor circuit is electrically connected to the first light emitting element;
 applying a forward voltage to the first light emitting element and the second light emitting element;
 mounting a light emitting module on the light emitting device after application of the forward voltage,
 wherein the light emitting module comprises the first light emitting element and the monitor circuit.

3. A manufacturing method of a light emitting device comprising:
 forming a light emitting element comprising:
  forming a first electrode over a substrate;
  forming a first layer comprising molybdenum oxide and a hole transporting material over the first electrode;
  forming a second layer comprising a light emitting layer; and
  forming a second electrode over the second layer,
 applying forward voltage to the light emitting element;

applying reverse voltage to the light emitting element to detect a defect of the light emitting element;

repairing the defect by laser irradiation; and mounting a light emitting module on the light emitting device after application of the forward voltage and application of the reverse voltage, wherein the light emitting module comprises the light emitting element.

4. A manufacturing method according to claim 1, wherein the first layer further comprises rubrene.

5. A manufacturing method according to claim 2, wherein the first layer further comprises rubrene.

6. A manufacturing method according to claim 3, wherein the first layer further comprises rubrene.

7. A manufacturing method according to claim 1, wherein at least one of the first electrode and the second electrode comprises ITO.

8. A manufacturing method according to claim 2, wherein at least one of the first electrode and the second electrode comprises ITO.

9. A manufacturing method according to claim 3, wherein at least one of the first electrode and the second electrode comprises ITO.

10. A manufacturing method according to claim 2, wherein the monitor circuit further comprises a transistor and an inverter electrically connected to the second light emitting element.

11. A manufacturing method according to claim 2, wherein the first and second light emitting elements are formed in a same step.

12. A manufacturing method according to claim 1, wherein the light emitting device comprises a plurality of pixels, wherein the number of the plurality of pixels is larger than that of pixels for displaying an image, wherein a first image is displayed on a first part of the plurality of pixels during a first period, and wherein the first image is displayed on a second part of the plurality of pixels during a second period.

13. A manufacturing method according to claim 2, wherein the light emitting device comprises a plurality of pixels, wherein the number of the plurality of pixels is larger than that of pixels for displaying an image, wherein a first image is displayed on a first part of the plurality of pixels during a first period, and wherein the first image is displayed on a second part of the plurality of pixels during a second period.

14. A manufacturing method according to claim 1, wherein a driver circuit is removed before mounting the light emitting module on the light emitting device, and wherein the driver circuit is configured to apply a reverse voltage.

15. A manufacturing method according to claim 2, wherein a driver circuit is removed before mounting the light emitting module on the light emitting device, and wherein the driver circuit is configured to apply a reverse voltage.

16. A manufacturing method according to claim 3, wherein a driver circuit is removed before mounting the light emitting module on the light emitting device, and wherein the driver circuit is configured to apply the reverse voltage.

17. A manufacturing method according to claim 1, wherein the first layer is formed by co-evaporation method.

18. A manufacturing method according to claim 2, wherein the first layer is formed by co-evaporation method.

19. A manufacturing method according to claim 3, wherein the first layer is formed by co-evaporation method.

* * * * *

UNITED STATES PATENT AND TRADEMARK OFFICE
CERTIFICATE OF CORRECTION

PATENT NO. : 8,436,518 B2  
APPLICATION NO. : 12/890893  
DATED : May 7, 2013  
INVENTOR(S) : Shunpei Yamazaki et al.

Page 1 of 1

It is certified that error appears in the above-identified patent and that said Letters Patent is hereby corrected as shown below:

In the Specification:

Column 16, line 49; Change "fowled" to --formed--.
Column 16, line 52; Change "fowled" to --formed--.
Column 17, line 23; Change "fowled" to --formed--.
Column 28, line 31; Change "fowl" to --form--.
Column 29, line 33; Change "fowled" to --formed--.

Signed and Sealed this
Sixteenth Day of July, 2013

Teresa Stanek Rea
*Acting Director of the United States Patent and Trademark Office*